(12) United States Patent
Nacev et al.

(10) Patent No.: US 11,656,303 B2
(45) Date of Patent: May 23, 2023

(54) PSEUDO-BIRDCAGE COIL WITH VARIABLE TUNING AND APPLICATIONS THEREOF

(71) Applicant: PROMAXO, INC., Oakland, CA (US)

(72) Inventors: Aleksandar Nacev, San Francisco, CA (US); Jose Miguel Algarín Guisado, Oakland, CA (US)

(73) Assignee: PROMAXO, INC., Oakland, CA (US)

( * ) Notice: Subject to any disclaimer, the term of this patent is extended or adjusted under 35 U.S.C. 154(b) by 0 days.

(21) Appl. No.: 17/310,698

(22) PCT Filed: Feb. 24, 2020

(86) PCT No.: PCT/US2020/019524
§ 371 (c)(1),
(2) Date: Aug. 18, 2021

(87) PCT Pub. No.: WO2020/172672
PCT Pub. Date: Aug. 27, 2020

(65) Prior Publication Data
US 2022/0043084 A1 Feb. 10, 2022

Related U.S. Application Data

(60) Provisional application No. 62/809,503, filed on Feb. 22, 2019.

(51) Int. Cl.
*G01R 33/34* (2006.01)
(52) U.S. Cl.
CPC ... *G01R 33/34076* (2013.01); *G01R 33/3403* (2013.01)
(58) Field of Classification Search
CPC ............ G01R 33/3403; G01R 33/34076
See application file for complete search history.

(56) References Cited

U.S. PATENT DOCUMENTS

| 5,309,104 A | 5/1994 | Frederick |
| 5,559,434 A | 9/1996 | Takahashi et al. |

(Continued)

FOREIGN PATENT DOCUMENTS

| EP | 3571211 A1 | 11/1993 |
| JP | H0690923 A | 4/1994 |

(Continued)

OTHER PUBLICATIONS

International Search Report and Written Opinion for International PCT Application No. PCT/US2020/019524, dated Jun. 14, 2020.

(Continued)

*Primary Examiner* — Dixomara Vargas
(74) *Attorney, Agent, or Firm* — Wilson Sonsini Goodrich & Rosati

(57) ABSTRACT

A coil for single-sided magnetic resonance imaging system is disclosed. The coil is configured to generate a magnetic field outwards away from the coil. The coil includes a first ring and a second ring having different diameters and the current flows through the coil to generate the magnetic field in a region of interest. A method of imaging via a magnetic imaging apparatus is also disclosed. The method includes providing a power source and providing a coil that includes a first ring and a second ring having different diameters. The method includes turning on the power source so as to flow a current through the coil to generate a magnetic field in a region of interest. The method also includes selectively turning on a particular set of electronic components so as to pulse the magnetic field in a narrower frequency range.

29 Claims, 11 Drawing Sheets

(56) References Cited

U.S. PATENT DOCUMENTS

| | | | | |
|---|---|---|---|---|
| 5,602,479 | A * | 2/1997 | Srinivasan | G01R 33/34046 324/318 |
| 6,060,882 | A * | 5/2000 | Doty | G01R 33/34046 324/318 |
| 6,100,691 | A * | 8/2000 | Yeung | G01R 33/34046 324/318 |
| 6,252,403 | B1 * | 6/2001 | Alsop | G01R 33/34053 324/300 |
| 6,344,745 | B1 * | 2/2002 | Reisker | G01R 33/34046 324/318 |
| 6,420,871 | B1 * | 7/2002 | Wong | G01R 33/34046 324/318 |
| 6,529,003 | B2 | 3/2003 | Goto et al. | |
| 6,788,058 | B1 * | 9/2004 | Petropoulos | G01R 33/34046 324/318 |
| 6,812,705 | B1 * | 11/2004 | Sellers | G01R 33/34076 324/315 |
| 7,084,629 | B2 * | 8/2006 | Monski, Jr. | G01R 33/34046 324/318 |
| 7,382,130 | B2 * | 6/2008 | Miyauchi | G01R 33/341 324/318 |
| 7,466,323 | B2 | 12/2008 | Krishnamurthy et al. | |
| 7,501,828 | B1 | 3/2009 | Wong et al. | |
| 7,589,530 | B2 | 9/2009 | Habara et al. | |
| 7,728,591 | B2 | 6/2010 | Weizenecker et al. | |
| 7,911,209 | B2 * | 3/2011 | Alradady | G01R 33/34076 324/318 |
| 3,002,465 | A1 | 8/2011 | Ahn | |
| 7,990,146 | B2 * | 8/2011 | Lazar | G01R 33/34046 324/318 |
| 10,830,848 | B2 | 11/2020 | Rosen et al. | |
| 2003/0071622 | A1 * | 4/2003 | Reisker | G01R 33/34046 324/318 |
| 2004/0066194 | A1 | 4/2004 | Slade et al. | |
| 2004/0155659 | A1 | 8/2004 | Prado | |
| 2004/0178791 | A1 * | 9/2004 | Havens | G01R 33/3806 324/318 |
| 2005/0099179 | A1 * | 5/2005 | Monski, Jr. | G01R 33/34046 324/318 |
| 2005/0253581 | A1 * | 11/2005 | Avdievich | G01R 33/3678 324/318 |
| 2007/0285096 | A1 | 12/2007 | Soutome et al. | |
| 2008/0150533 | A1 | 6/2008 | Habara et al. | |
| 2009/0021255 | A1 | 1/2009 | Devries et al. | |
| 2009/0201022 | A1 * | 8/2009 | Oppelt | G01R 33/34076 324/322 |
| 2009/0267606 | A1 | 10/2009 | Lazar et al. | |
| 2010/0280361 | A1 | 11/2010 | Devries et al. | |
| 2012/0283550 | A1 * | 11/2012 | Driemel | G01R 33/30 600/415 |
| 2012/0293175 | A1 * | 11/2012 | Wosik | G01R 33/3403 324/322 |
| 2012/0323110 | A1 * | 12/2012 | Blake | A61B 5/055 600/410 |
| 2015/0038830 | A1 | 2/2015 | Blasche et al. | |
| 2015/0285882 | A1 | 10/2015 | Mezrich et al. | |
| 2016/0041239 | A1 | 2/2016 | Piron et al. | |
| 2016/0313420 | A1 | 10/2016 | Rasche et al. | |
| 2017/0038444 | A1 * | 2/2017 | Seeber | G01R 33/3858 |
| 2017/0040107 | A1 * | 2/2017 | Peralta | H01F 27/292 |
| 2017/0054213 | A1 * | 2/2017 | Singh | H04B 5/0087 |
| 2017/0059675 | A1 * | 3/2017 | Moon | G01R 33/3858 |
| 2017/0164915 | A1 * | 6/2017 | Li | A61B 6/0435 |
| 2018/0110459 | A1 * | 4/2018 | Nevo | A61B 5/4872 |
| 2018/0275233 | A1 * | 9/2018 | Yang | G01R 33/34046 |
| 2018/0321339 | A1 * | 11/2018 | Yang | G01R 33/3657 |
| 2018/0356480 | A1 | 12/2018 | Weinberg et al. | |
| 2019/0074577 | A1 * | 3/2019 | Kim | H04B 5/0025 |
| 2019/0097447 | A1 * | 3/2019 | Partovi | H01F 27/2823 |
| 2019/0154774 | A1 * | 5/2019 | Hushek | G01R 33/34007 |
| 2020/0003856 | A1 | 1/2020 | Constable et al. | |
| 2020/0049779 | A1 * | 2/2020 | Overweg | G01R 33/546 |
| 2021/0132169 | A1 * | 5/2021 | Yang | G01R 33/422 |
| 2022/0043084 | A1 | 2/2022 | Nacev et al. | |
| 2022/0113361 | A1 | 4/2022 | Nacev et al. | |

FOREIGN PATENT DOCUMENTS

| | | |
|---|---|---|
| JP | 2001145608 A | 5/2001 |
| JP | 2002052002 A | 2/2002 |
| JP | 2007325826 A | 12/2007 |
| JP | 2008119091 A | 5/2008 |
| KR | 1020160133506 A | 11/2016 |
| KR | 1020180045586 A | 5/2018 |
| KR | 102076566 B1 | 2/2020 |
| WO | 2018106760 A1 | 6/2018 |
| WO | 2020172672 A1 | 8/2020 |
| WO | 2020172673 A1 | 8/2020 |

OTHER PUBLICATIONS

International Preliminary Report on Patentability for International PCT Application No. PCT/US2020/019524, dated Jun. 10, 2021.
He et al., The Novel Design of a Single-Sided MRI Probe for Assessing Burn Depth, Sensors (Mar. 6, 2017), 17 [526]:1-11.
International Search Report and Written Opinion for International PCT Application No. PCT/US2020/019530, dated Jun. 11, 2020.
Partial Supplementary European Search Report for corresponding European Patent Application No. 20758906.0, iated Nov. 10, 2022.
Supplementary European Search Report for corresponding European Patent Application No. 20759888.9, dated Nov. 10, 2022.

* cited by examiner

PSEUDO-BIRDCAGE COIL WITH VARIABLE TUNING AND APPLICATIONS THEREOF

CROSS-REFERENCE TO RELATED APPLICATIONS

The present application is a U.S. National Stage Entry under 35 U.S.C. § 371 of International PCT Application No. PCT/US2020/019524, entitled "PSEUDO-BIRDCAGE COIL WITH VARIABLE TUNING AND APPLICATIONS THEREOF," filed Feb. 24, 2020, which claims the benefit of priority under 35 U.S.C. § 119(e) to U.S. Provisional Application No. 62/809,503, entitled "PSEUDO-BIRDCAGE COIL WITH VARIABLE TUNING AND APPLICATIONS THEREOF", filed on Feb. 22, 2019, which are incorporated by reference herein in their entireties.

BACKGROUND

Magnetic resonance imaging systems have primarily been focused on leveraging an enclosed form factor. This form factor includes surrounding the imaging region with electromagnetic field producing materials and imaging system components. A typical magnetic resonance imaging system includes a cylindrical bore magnet where the patient is placed within the tube of the magnet for imaging. Components, such as radio frequency (RF) transmission (TX) and reception (RX) coils are then placed on many sides of the patient to effectively surround the patient in order to perform the imaging.

Typically, the RF-TX coils are large and fully surround the field of view (i.e., the imaging region), while the RF-RX coils are small and placed right on the field of view. The placement of components, in most current magnetic resonance imaging systems, to virtually surround the patient severely limits the movement of the patient, sometimes causing additional burdens during situating or removing the patient to and from within the imaging region. In other current magnetic resonance imaging systems, the patient is placed between two large plates to relieve some physical restrictions on patient placement. Regardless, a need exists to provide modern imaging configurations in next generation magnetic resonance imaging systems that further alleviate the aforementioned issues with regards to patient comfort and burdensome limitations.

SUMMARY

In accordance with various embodiments, a magnetic imaging apparatus is provided. The apparatus includes a power source for providing a current, and a coil electrically connected to the power source. The coil includes a first ring and a second ring, wherein the first ring and the second ring have different diameters. The first ring and the second ring are connected via one or more rungs. The power source is configured to flow current through the first ring, the second ring, and the one or more rungs to generate an electromagnetic field in a region of interest.

In accordance with various embodiments, the electromagnetic field is between about 1 µT and about 10 mT. In accordance with various embodiments, the electromagnetic field is pulsed at a radio frequency between about 1 kHz and about 2 GHz. In accordance with various embodiments, the first ring, the second ring, and the one or more rungs are connected to form a single current loop. In accordance with various embodiments, the coil is non-planar and oriented to partially surround the region of interest. In accordance with various embodiments, the first ring, the second ring, and the one or more rungs are non-planar to each other. In accordance with various embodiments, one of the first and second ring is tilted with respect to the other ring. In accordance with various embodiments, one of the first or second ring is closer to the region of interest than the other ring. In accordance with various embodiments, the first ring and the second ring comprise different materials. In accordance with various embodiments, the first ring and the second ring have diameters between about 10 µm to about 10 m. In accordance with various embodiments, the first ring has a larger diameter than the second ring. In accordance with various embodiments, a diameter of the second ring is between a size of the region of interest and a diameter of the first ring.

In accordance with various embodiments, the coil further includes one or more electronic components for tuning the electromagnetic field. In accordance with various embodiments, the one or more electronic components include at least one of a varactor, a PIN diode, a capacitor, an inductor, a MEMS switch, a solid state relay, or a mechanical relay. In accordance with various embodiments, the one or more electronic components used for tuning includes at least one of dielectrics, capacitors, inductors, conductive metals, metamaterials, or magnetic metals. In accordance with various embodiments, the coil is cryogenically cooled. In accordance with various embodiments, at least one of the first ring, the second ring, and the one or more rungs comprise hollow tubes for fluid cooling. In accordance with various embodiments, at least one of the first ring and the second ring comprise a plurality of windings or litz wires. In accordance with various embodiments, at least one of the first ring, the second ring, and the one or more rungs are connected to a capacitor.

In accordance with various embodiments, the first ring is attached to a first portion of the one or more rungs and the second ring is attached to a second portion of the one or more rungs, and wherein the first and second portion of the one or more rungs form an overlapping contact area. In accordance with various embodiments, the overlapping contact area is adjustable. In accordance with various embodiments, the first portion is a cylinder or a tube, and the second portion is a concentric tube, or vice versa, and wherein the first portion and the second portion are configured to slide past each other.

In accordance with various embodiments, a method of operating a magnetic imaging apparatus is provided. The method includes providing a power source and providing a coil electrically connected to the power source. The coil includes a first ring and a second ring, wherein the first ring and the second ring have different diameters. The first ring and the second ring are connected via one or more rungs. The method also includes turning on the power source so as to flow a current through the coil thereby generating a magnetic field in a region of interest.

In accordance with various embodiments, the magnetic field is between about 1 µT and about 10 mT. In accordance with various embodiments, the magnetic field is pulsed at a radio frequency (RF) between about 1 kHz and about 2 GHz. In accordance with various embodiments, the coil further includes one or more electronic components.

In accordance with various embodiments, the method further includes tuning the magnetic field using one or more components provided with the coil. In accordance with various embodiments, tuning the magnetic field is performed via at least one of changing the current of the one or more electronic components or by changing physical locations of the one or more electronic components. In accordance with various embodiments, the one or more electronic components include at least one of a varactor, a PIN diode, a capacitor, an inductor, a MEMS switch, a solid state relay, or a mechanical relay. In accordance with various embodiments, at least one of the first ring, the second ring, and the one or more rungs are connected to a capacitor.

In accordance with various embodiments, the method further includes selectively turning on a particular set of electronic components so as to pulse the magnetic field in a narrower frequency range.

In accordance with various embodiments, a magnetic imaging apparatus is provided. The magnetic imaging apparatus includes a power source for providing a current, and a coil electrically connected to the power source. The coil includes a first ring and a second ring. The first ring and the second ring are connected via one or more capacitors. The power source is configured to flow current through the first ring, the second ring, and the one or more capacitors to generate an electromagnetic field in a region of interest.

In accordance with various embodiments, the electromagnetic field is between about 1 µT and about 10 mT. In accordance with various embodiments, the electromagnetic field is pulsed at a radio frequency between about 1 kHz and about 2 GHz. In accordance with various embodiments, the first ring and the second ring are connected via one or more rungs. In accordance with various embodiments, the coil is non-planar and oriented to partially surround the region of interest. In accordance with various embodiments, the first ring, the second ring, and the one or more rungs are non-planar to each other. In accordance with various embodiments, one of the first and second ring is tilted with respect to the other ring. In accordance with various embodiments, one of the first or second ring is closer to the region of interest than the other ring. In accordance with various embodiments, the first ring and the second ring comprise different materials. In accordance with various embodiments, the first ring and the second ring have diameters between about 10 µm to about 10 m. In accordance with various embodiments, a diameter of the second ring is between a size of the region of interest and a diameter of the first ring.

In accordance with various embodiments, the coil further includes one or more electronic components for tuning the electromagnetic field. In accordance with various embodiments, the one or more electronic components include at least one of a varactor, a PIN diode, a capacitor, an inductor, a MEMS switch, a solid state relay, or a mechanical relay. In accordance with various embodiments, the one or more electronic components used for tuning includes at least one of dielectrics, capacitors, inductors, conductive metals, metamaterials, or magnetic metals. In accordance with various embodiments, the coil is cryogenically cooled. In accordance with various embodiments, at least one of the first ring, the second ring, and the one or more rungs comprise hollow tubes for fluid cooling. In accordance with various embodiments, at least one of the first ring and the second ring comprise a plurality of windings or litz wires. In accordance with various embodiments, at least one of the first ring, the second ring, and the one or more rungs are connected to a capacitor.

In accordance with various embodiments, the first ring is attached to a first portion of the one or more rungs and the second ring is attached to a second portion of the one or more rungs, and wherein the first and second portion of the one or more rungs form an overlapping contact area. In accordance with various embodiments, the overlapping contact area is adjustable. In accordance with various embodiments, the first portion is a cylinder or a tube, and the second portion is a concentric tube, or vice versa, and wherein the first portion and the second portion are configured to slide past each other.

In accordance with various embodiments, a method of operating a magnetic imaging apparatus is provided. The method includes providing a power source and providing a coil electrically connected to the power source. The coil includes a first ring and a second ring. The first ring and the second ring are connected via one or more capacitors. The method also includes turning on the power source so as to flow a current through the coil thereby generating a magnetic field in a region of interest.

In accordance with various embodiments, the magnetic field is between about 1 µT and about 10 mT. In accordance with various embodiments, the magnetic field is pulsed at a radio frequency (RF) between about 1 kHz and about 2 GHz. In accordance with various embodiments, the first ring and the second ring are connected via one or more rungs. In accordance with various embodiments, the coil further includes one or more electronic components. In accordance with various embodiments, the method further includes tuning the magnetic field using one or more components provided with the coil. In accordance with various embodiments, tuning the magnetic field is performed via at least one of changing the current of the one or more electronic components or by changing physical locations of the one or more electronic components. In accordance with various embodiments, the one or more electronic components include at least one of a varactor, a PIN diode, a capacitor, an inductor, a MEMS switch, a solid state relay, or a mechanical relay. In accordance with various embodiments, at least one of the first ring, the second ring, and the one or more rungs are connected to a capacitor.

In accordance with various embodiments, the method further includes selectively turning on a particular set of electronic components so as to pulse the magnetic field in a narrower frequency range.

In accordance with various embodiments, a magnetic imaging apparatus is provided. The magnetic imaging apparatus includes a power source for providing a current, and a coil electrically connected to the power source. The coil includes a solid sheet of metal having one or more slits disposed within the sheet. At least one of the one or more slits includes a tuning element. The power source is configured to flow current through the coil to generate an electromagnetic field in a region of interest.

In accordance with various embodiments, the electromagnetic field is between about 1 µT and about 10 mT. In accordance with various embodiments, the electromagnetic field is pulsed at a radio frequency between about 1 kHz and about 2 GHz. In accordance with various embodiments, the coil is non-planar and oriented to partially surround the region of interest. In accordance with various embodiments, the coil has an outer edge with a diameter between about 10 µm to about 10 m.

In accordance with various embodiments, the solid sheet of metal being the first sheet having a first slit with a first tuning element disposed therewithin, the coil further includes a second sheet of metal having a second slit having a second tuning element disposed therewithin. The second sheet of metal is stacked on top of the first sheet such that the first slit and the second slit are offset rotationally.

In accordance with various embodiments, the solid sheet of metal includes at least two slits with each slit having a tuning element, wherein the at least two slits are positioned within the solid sheet of metal such that each of the tuning elements are positioned equally spaced from one another.

In accordance with various embodiments, the apparatus further includes one or more electronic components for tuning the electromagnetic field, wherein the one or more electronic components include at least one of a varactor, a PIN diode, a capacitor, an inductor, a MEMS switch, a solid state relay, or a mechanical relay. In accordance with various embodiments, the one or more electronic components used for tuning includes at least one of dielectrics, capacitors, inductors, conductive metals, metamaterials, or magnetic metals.

In accordance with various embodiments, the solid sheet of metal comprise hollow tubes for fluid cooling. In accordance with various embodiments, the coil is cryogenically cooled. In accordance with various embodiments, the tuning element comprises a capacitor.

In accordance with various embodiments, a method of operating a magnetic imaging apparatus is provided. The method includes providing a power source and providing a coil electrically connected to the power source. The coil includes a solid sheet of metal having one or more slits disposed within the sheet. At least one of the one or more slits includes a tuning element. The method also includes turning on the power source so as to flow a current through the coil thereby generating a magnetic field in a region of interest.

In accordance with various embodiments, the magnetic field is between about 1 µT and about 10 mT. In accordance with various embodiments, the magnetic field is pulsed at a radio frequency (RF) between about 1 kHz and about 2 GHz. In accordance with various embodiments, the coil further includes one or more electronic components. The method further includes tuning the magnetic field using one or more components provided with the coil. In accordance with various embodiments, tuning the magnetic field is performed via at least one of changing the current of the one or more electronic components or by changing physical locations of the one or more electronic components. In accordance with various embodiments, the one or more electronic components include at least one of a varactor, a PIN diode, a capacitor, an inductor, a MEMS switch, a solid state relay, or a mechanical relay. In accordance with various embodiments, the tuning element comprises a capacitor.

In accordance with various embodiments, the method further includes selectively turning on a particular set of electronic components so as to pulse the magnetic field in a narrower frequency range.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Figure 1:
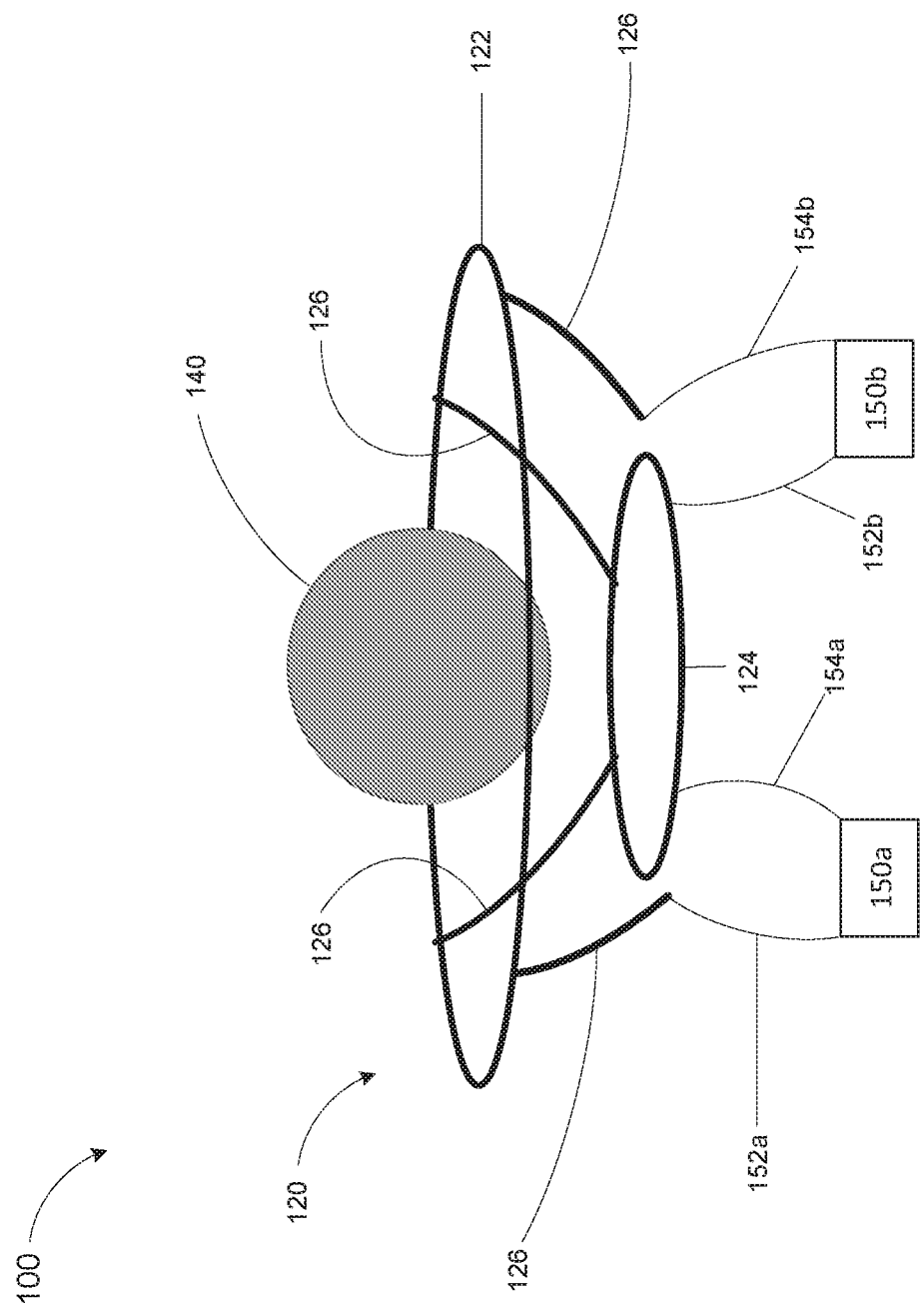
FIG. 1 is a schematic view of an implementation of a magnetic imaging apparatus, according to various embodiments.

Typical RF-TX coil configurations used in modern magnetic resonance imaging systems are of a birdcage coil design. A typical birdcage coil includes two large rings placed on opposite sides of the imaging region (i.e., where the patient resides) that are each electrically connected by one or more rungs. Depending on the operating frequency and configurations of the RF-TX coil, the rungs or the rings contain capacitive tuning elements. To ensure proper imaging, the RF-TX coil excitation power is produced uniformly over the imaging region (also referred to herein as "region of interest"). The birdcage RF-TX coil gets its uniform power profile due to its large diameter rings and consistent rung/ring size. Since the imaging signal improves the more the coil surrounds the patient, the birdcage coil is typically configured to encompass a patient so that the signal produced from within the imaging region/the patient is sufficiently uniform.

To further improve patient comfort and reduce burdensome movement limitations of the current magnetic resonance imaging systems, single-sided magnetic resonance imaging systems have been developed. The disclosure as described herein generally relates to a magnetic imaging apparatus of a single-sided magnetic resonance imaging system and its applications. In particular, the described technology relates to a magnetic imaging apparatus having a pseudo-birdcage coil with variable tuning configured to work in a single-sided magnetic resonance imaging system. As described herein, the disclosed single-sided magnetic resonance imaging system can image the patient, as compared to systems that are small scale, have a limited field of view, and image extremities of patients. Moreover, the system can be configured so that the patient is covered on one side, but not completely surrounded, by the electromagnetic field producing materials and imaging system components. The configurations as described herein offer less restriction in patient movement while reducing unnecessary burden during situating and/or removing of the patient from the magnetic resonance imaging system. In other words, the patient would not feel entrapped in the magnetic resonance imaging system with the placement of a pseudo-birdcage coil on only one side of the patient.

The technology disclosed herein includes novel configurations of a single-sided coil, as well as methods of generating RF transmission pulses from the single-sided coil. The single-sided coil as described herein includes one or more coil configurations that generate a uniform field away from the coil itself. The disclosed configurations are intended to generate a uniform field that projects outwards and away from the coil because the coil can no longer surround the patient for imaging in a single-sided magnetic resonance imaging system. In other words, for a RF-TX coil to work in a single-sided magnetic resonance imaging system, the uniform RF field required for imaging has to be generated away from the coil itself. In order to project the field out and away from the single-sided coil, the disclosed coil configurations include different sized rings that are connected via one or more rungs. In various implementations as described herein, the single-sided coil can be configured with rings of different sizes, as well as varying distance between the rings and materials of the rings. In various implementations, the coil may also have an electromagnetic shield placed on one side of the coil to further improve the projection of the electromagnetic field away from the direction of the shield.

As disclosed herein, the unequal sizing of the rings and the curvature of the rungs are adjusted to position the region of interest (the imaging region) and the uniformity of the RF power in that region. As the rings become equal in size, the field of view moves inwards into the coil center and therefore resembles a traditional birdcage coil. As the rings change in size, the uniform region is extended outwards away from the coil itself to allow inhibited movements or access by a patient.

Moreover, the configurations of the single-sided RF-TX coil described herein can generate appropriate ranges of radio frequencies needed to effectively excite the protons within the field of view, i.e., in the imaging region. Since a single-sided magnetic resonance imaging system form factor typically has a linear magnetic gradient with a large signal bandwidth, the RF-TX coil configurations as described herein are intended to accommodate the expansive ranges of radio frequencies needed for proton excitation.

FIG. 1 shows a schematic view of an example implementation of a magnetic imaging apparatus 100, in accordance with various embodiments. As shown in FIG. 1, the apparatus 100 includes a radio frequency transmission (RF-TX) coil 120 that projects the RF power outwards away from the coil 120. The coil 120 has two rings 122 and 124 that are connected by one or more rungs 126. As shown in FIG. 1, the coil 120 is also connected to a power source 150a and/or a power source 150b (collectively referred to herein as "power source 150"). In various implementations, power sources 150a and 150b can be configured for power input and/or signal input, and can generally be referred to as coil input. In various implementations, the power source 150a and/or 150b are configured to provide contact via electrical contacts 152a and/or 152b (collectively referred to herein as "electrical contact 152"), and electrical contacts 154a and/or 154b (collectively referred to herein as "electrical contact 154") by attaching the electrical contacts 152 and 154 to one or more rungs 126. The coil 120 is configured to project a uniform RF field within a field of view 140. In various implementations, the field of view 140 is a region of interest for magnetic resonance imaging (i.e., imaging region) where a patient resides. Since the patient resides in the field of view 140 away from the coil 120, the apparatus 100 is suitable for use in a single-sided magnetic resonance imaging system.

In various implementations, the coil inputs 150a and 150b can be powered by two signals that are 90 degrees out of phase from each other, for example, via quadrature excitation. In various implementations, only one coil input might exist, 150a, and therefore the other coil input, 150b, can be dynamically configured using tuning methods, for example, as outlined in circuit diagram 300 shown in FIG. 3, to adjust the coil 120 to be powered in a linear polarization mode.

In various implementations, the coil 120 includes the ring 122 and the ring 124 that are positioned co-axially along the same axis but at a distance away from each other, as shown in FIG. 1. In various implementations, the ring 122 and the ring 124 are separated by a distance ranging from about 0.1 m to about 10 m. In various implementations, the ring 122 and the ring 124 are separated by a distance ranging from about 0.2 m to about 5 m, about 0.3 m to about 2 m, about 0.2 m to about 1 m, about 0.1 m to about 0.8 m, or about 0.1 m to about 1 m, inclusive of any separation distance therebetween. In various implementations, the coil 120 includes the ring 122 and the ring 124 that are positioned non-co-axially but along the same direction and separated at a distance ranging from about 0.2 m to about 5 m. In various implementations, the ring 122 and the ring 124 can also be tilted with respect to each other. In various implementations, the tilt angle can be from 1 degree to 90 degrees, from 1 degree to 5 degrees, from 5 degrees to 10 degrees, from 10 degrees to 25 degrees, from 25 degrees to 45 degrees, and from 45 degrees to 90 degrees.

In various implementations, the ring 122 and the ring 124 have the same diameter. In various implementations, the ring 122 and the ring 124 have different diameters and the ring 122 has a larger diameter than the ring 124, as shown in FIG. 1. In various implementations, the ring 122 and the ring 124 have different diameters and the ring 122 has a smaller diameter than the ring 124. In various implementations, the ring 122 and the ring 124 of the coil 120 are configured to create the imaging region 140 containing a uniform RF power profile within the field of view 140, a field of view that is not centered within the RF-TX coil and is instead projected outwards in space from the coil itself.

In various implementations, the ring 122 has a diameter between about 10 µm and about 10 m. In various implementations, the ring 122 has a diameter between about 0.001 m and about 9 m, between about 0.01 m and about 8 m, between about 0.03 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any diameter therebetween.

In various implementations, the ring 124 has a diameter between about 10 µm and about 10 m. In various implementations, the ring 124 has a diameter between about 0.001 m and about 9 m, between about 0.01 m and about 8 m, between about 0.03 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any diameter therebetween.

In various implementations, the ring 122 and the ring 124 are connected by one or more rungs 126, as shown in FIG. 1. In various implementations, the one or more rungs 126 are connected to the ring 122 and 124 so as to form a single electrical circuit loop (or single current loop). As shown in FIG. 1, for example, one end of the one or more rungs 126 is connected to the electrical contact 152 of the power source 150 and another end of the one or more rungs 126 be connected to the electrical contact 154 so that the ring 120 completes an electrical circuit.

In various implementations, the ring 122 is a discontinuous ring and the electrical contact 152 and the electrical contact 154 can be electrically connected to two opposite ends of the ring 122 to form an electrical circuit powered by the power source 150. Similarly, in various implementations, the ring 124 is a discontinuous ring and the electrical contact 152 and the electrical contact 154 can be electrically connected to two opposite ends of the ring 124 to form an electrical circuit powered by the power source 150.

In various implementations, the rings 122 and 124 are not circular and can instead have a cross section that is elliptical, square, rectangular, or trapezoidal, or any shape or form having a closed loop. In various implementations, the rings 122 and 124 may have cross sections that vary in two different axial planes with the primary axis being a circle and the secondary axis having a sinusoidal shape or some other geometric shape. In various implementations, the coil 120 may include more than two rings 122 and 124, each connected by rungs that span and connect all the rings. In various implementations, the coil 120 may include more than two rings 122 and 124, each connected by rungs that alternate connection points between rings. In various implementations, the ring 122 may contain a physical aperture for access. In various implementations, the ring 122 may be a solid sheet without a physical aperture.

In various implementations, the coil 120 generates an electromagnetic field (also referred to herein as "magnetic field") strength between about 1 µT and about 10 mT. In various implementations, the coil 120 can generate a magnetic field strength between about 10 µT and about 5 mT, about 50 µT and about 1 mT, or about 100 µT and about 1 mT, inclusive of any magnetic field strength therebetween.

In various implementations, the coil 120 generates an electromagnetic field that is pulsed at a radio frequency between about 1 kHz and about 2 GHz. In various implementations, the coil 120 generates a magnetic field that is pulsed at a radio frequency between about 1 kHz and about 1 GHz, about 10 kHz and about 800 MHz, about 50 kHz and about 300 MHz, about 100 kHz and about 100 MHz, about 10 kHz and about 10 MHz, about 10 kHz and about 5 MHz, about 1 kHz and about 2 MHz, about 50 kHz and about 150 kHz, about 80 kHz and about 120 kHz, about 800 kHz and about 1.2 MHz, about 100 kHz and about 10 MHz, or about 1 MHz and about 5 MHz, inclusive of any frequencies therebetween.

In various implementations, the coil 120 is oriented to partially surround the region of interest. In various implementations, the ring 122, the ring 124, and the one or more rungs 126 are non-planar to each other. Said another way, the ring 122, the ring 124, and the one or more rungs 126 form a three-dimensional structure that surrounds the region of interest where a patient resides. In various implementations, the ring 122 is closer to the region of interest than the ring 124, as shown in FIG. 1. In various implementations, the region of interest has a size of about 0.1 m to about 1 m. In various implementations, the region of interest is smaller than the diameter of the ring 122. In various implementations, the region of interest is smaller than both the diameter of the ring 124 and the diameter of the ring 122, as shown in FIG. 1. In various implementations, the region of interest has a size that is smaller than the diameter of the ring 122 and larger than the diameter of the ring 124.

In various implementations, the ring 122, the ring 124, or the rungs 126 include the same material. In various implementations, the ring 122, the ring 124, or the rungs 126 include different materials. In various implementations, the ring 122, the ring 124, or the rungs 126 include hollow tubes or solid tubes. In various implementations, the hollow tubes or solid tubes can be configured for air or fluid cooling. In various implementations, each of the ring 122 or the ring 124 or the rungs 126 includes one or more electrically conductive windings. In various implementations, the windings include litz wires or any electrical conducting wires. These additional windings could be used to improve performance by lowering the resistance of the windings at the desired frequency. In various implementations, the ring 122, the ring 124, or the rungs 126 include copper, aluminum, silver, silver paste, or any high electrical conducting material, including metal, alloys or superconducting metal, alloys or non-metal. In various implementations, the ring 122, the ring 124, or the rungs 126 may include metamaterials.

In various implementations, the ring 122, the ring 124, or the rungs 126 may contain separate electrically non-conductive thermal control channels designed to maintain the temperature of the structure to a specified setting. In various implementations, the thermal control channels can be made from electrically conductive materials and integrated as to carry the electrical current.

In various implementations, the coil 120 includes one or more electronic components for tuning the magnetic field. The one or more electronic components can include a varactor, a PIN diode, a capacitor, or a switch, including a micro-electro-mechanical system (MEMS) switch, a solid state relay, or a mechanical relay. In various implementations, the coil can be configured to include any of the one or more electronic components along the electrical circuit. In various implementations, the one or more components can include mu metals, dielectrics, magnetic, or metallic components not actively conducting electricity and can tune the coil. In various implementations, the one or more electronic components used for tuning includes at least one of dielectrics, conductive metals, metamaterials, or magnetic metals. In various implementations, tuning the electromagnetic field includes changing the current or by changing physical locations of the one or more electronic components. In various implementations, the coil is cryogenically cooled to reduce resistance and improve efficiency. In various implementations, the first ring and the second ring comprise a plurality of windings or litz wires.

In various implementations, the coil 120 is configured for a magnetic resonance imaging system that has a magnetic field gradient across the field of view. The field gradient allows for imaging slices of the field of view without using an additional electromagnetic gradient. As disclosed herein, the coil can be configured to generate a large bandwidth by combining multiple center frequencies, each with their own bandwidth. By superimposing these multiple center frequencies with their respective bandwidths, the coil 120 can effectively generate a large bandwidth over a desired frequency range between about 1 kHz and about 2 GHz. In various implementations, the coil 120 generates a magnetic field that is pulsed at a radio frequency between about 10 kHz and about 800 MHz, about 50 kHz and about 300 MHz, about 100 kHz and about 100 MHz, about 10 kHz and about 10 MHz, about 10 kHz and about 5 MHz, about 1 kHz and about 2 MHz, about 50 kHz and about 150 kHz, about 80 kHz and about 120 kHz, about 800 kHz and about 1.2 MHz, about 100 kHz and about 10 MHz, or about 1 MHz and about 5 MHz, inclusive of any frequencies therebetween.

Figure 2:
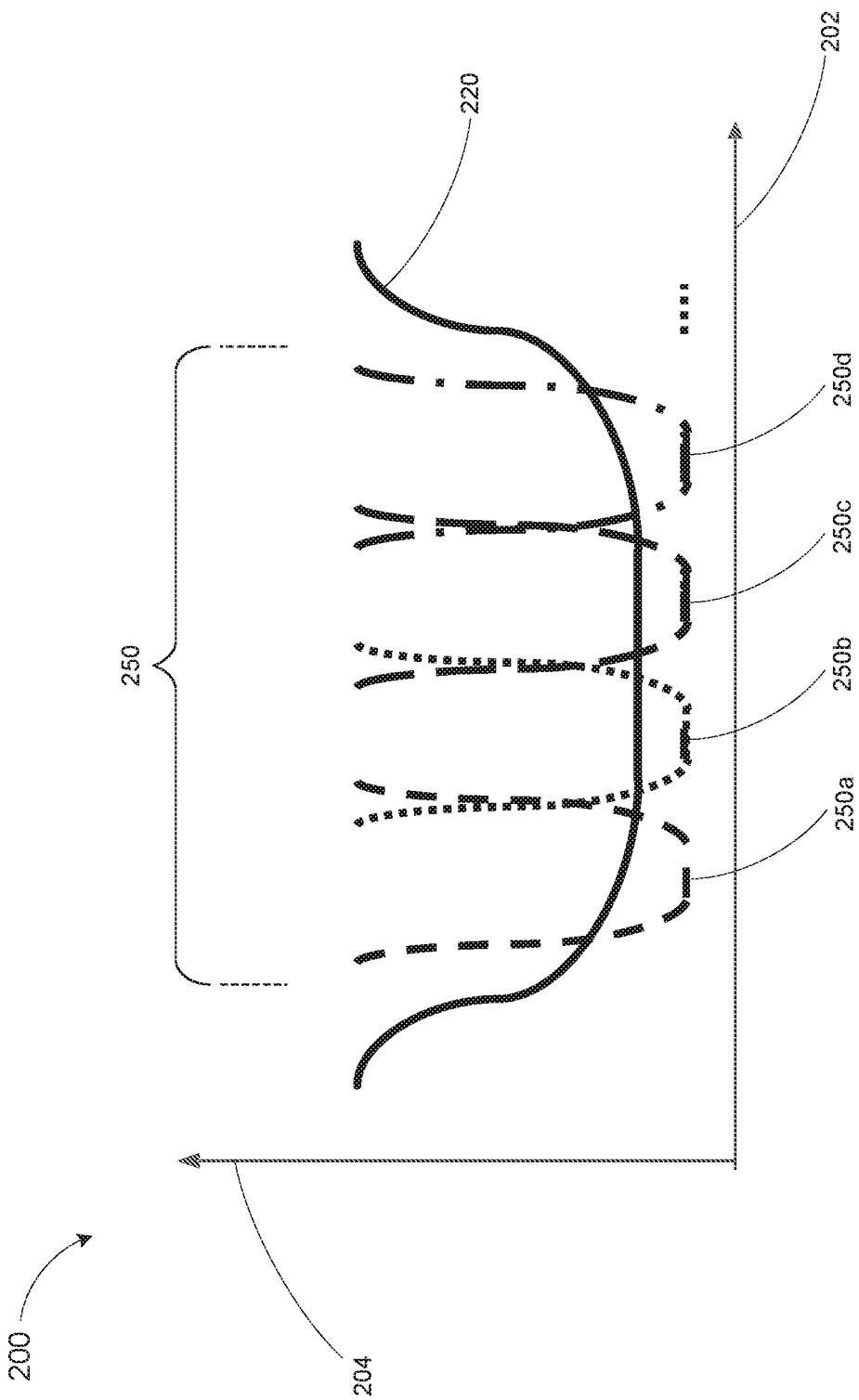
FIG. 2 is a graphical illustration showing example frequency responses of a magnetic imaging apparatus, according to various embodiments.

FIG. 2 is a graphical illustration 200 showing example frequency responses of the magnetic imaging apparatus 100. As shown in FIG. 2, a desired theoretical bandwidth 220 is shown in the graphical illustration 200 with a RF-TX power loss 204 over a desired RF frequency range 202. In some instances, the desired theoretical bandwidth 220 cannot be generated by a single coil due to size limitations or tuning element limitations because bandwidth 250 is too broad. However, in accordance with various embodiments, the coil 120 can be configured to create, for example, separate bandwidths 250a, 250b, 250c, and 250d by using selectively activated tuning circuitry. For example, when the chosen tuning circuitry is activated, a new coil tuning profile can be chosen allowing for a different frequency bandwidth profile to be created. When these new bandwidths are superimposed, the combined bandwidth 250 can form a larger bandwidth that is similar or substantially similar to the desired theoretical bandwidth 250. In this way, by multiplexing the frequency range in time, a larger frequency range can be achieved than with a single frequency tuned coil. In various implementations, each of the bandwidths 250a, 250b, 250c, and 250d can be selectively turned on or off by configuring the driving circuit that includes one or more PIN diodes, MEMS, solid state relays, electromechanical relays or capacitive switches and/or varactors to control and power the coil 120. In various implementations, each of the bandwidths 250a, 250b, 250c, and 250d can be tuned by mechanically moving or changing material properties of one or more components in the driving circuit. In other words, the magnetic imaging apparatus 100 can be configured to generate a large bandwidth 250 by controlling a single hardware, i.e., the coil 120, via the electrical control circuit to scan a plurality of successive narrow frequency ranges, and superimposing the RF-TX losses measured in those successive frequency ranges to produce the combined bandwidth 250. In various implementations, the switching time between frequencies can take about 1 µs to about 5 second, about 10 µs to about 1 second, 50 µs to about 500 ms, 100 µs to about 100 ms, or 1 ms to about 50 ms. In various implementations, the switching time is dependent upon the type of switching method employed with solid state components switching quickly and mechanical components changing the slowest.

In various implementations, the possible bandwidths can be chosen by activating a subset of rungs 126 in the coil 120. In various implementations, the system might have a given frequency when all the rungs 126 are activated, for example 8 rungs. Then to adjust the frequency, every other rung might be deactivated or electrically removed from the coil 120 setup by using one of electromechanical means, solid state relays, switchable RF chokes, MEMS switches, capacitors, or mechanical separation. The removal of these rungs from the coil system would generate a new tuned frequency for the system that could possibly be larger than the original tuned frequency.

In various implementations, the coil 120 can generate any number of separate bandwidths. The bandwidths 250a, 250b, 250c, and 250d shown in FIG. 2 are for illustrative purposes, and therefore, is a non-limiting example, and any number of separate bandwidths can be generated to form the large bandwidth 250. In various implementations, the bandwidths 250a, 250b, 250c, and 250d have similar or substantially similar bandwidths. In various implementations, the bandwidths 250a, 250b, 250c, and 250d have different bandwidths. In various implementations, each of the bandwidths 250a, 250b, 250c, and 250d has a bandwidth between about 1 kHz and about 2 GHz. In various implementations, each of the bandwidths 250a, 250b, 250c, and 250d can have a bandwidth between about 10 kHz and about 800 MHz, about 50 kHz and about 300 MHz, about 100 kHz and about 100 MHz, about 10 kHz and about 10 MHz, about 10 kHz and about 5 MHz, about 1 kHz and about 2 MHz, about 50 kHz and about 150 kHz, about 80 kHz and about 120 kHz, about 800 kHz and about 1.2 MHz, about 100 kHz and about 10 MHz, or about 1 MHz and about 5 MHz, inclusive of any bandwidths therebetween.

Figure 3:
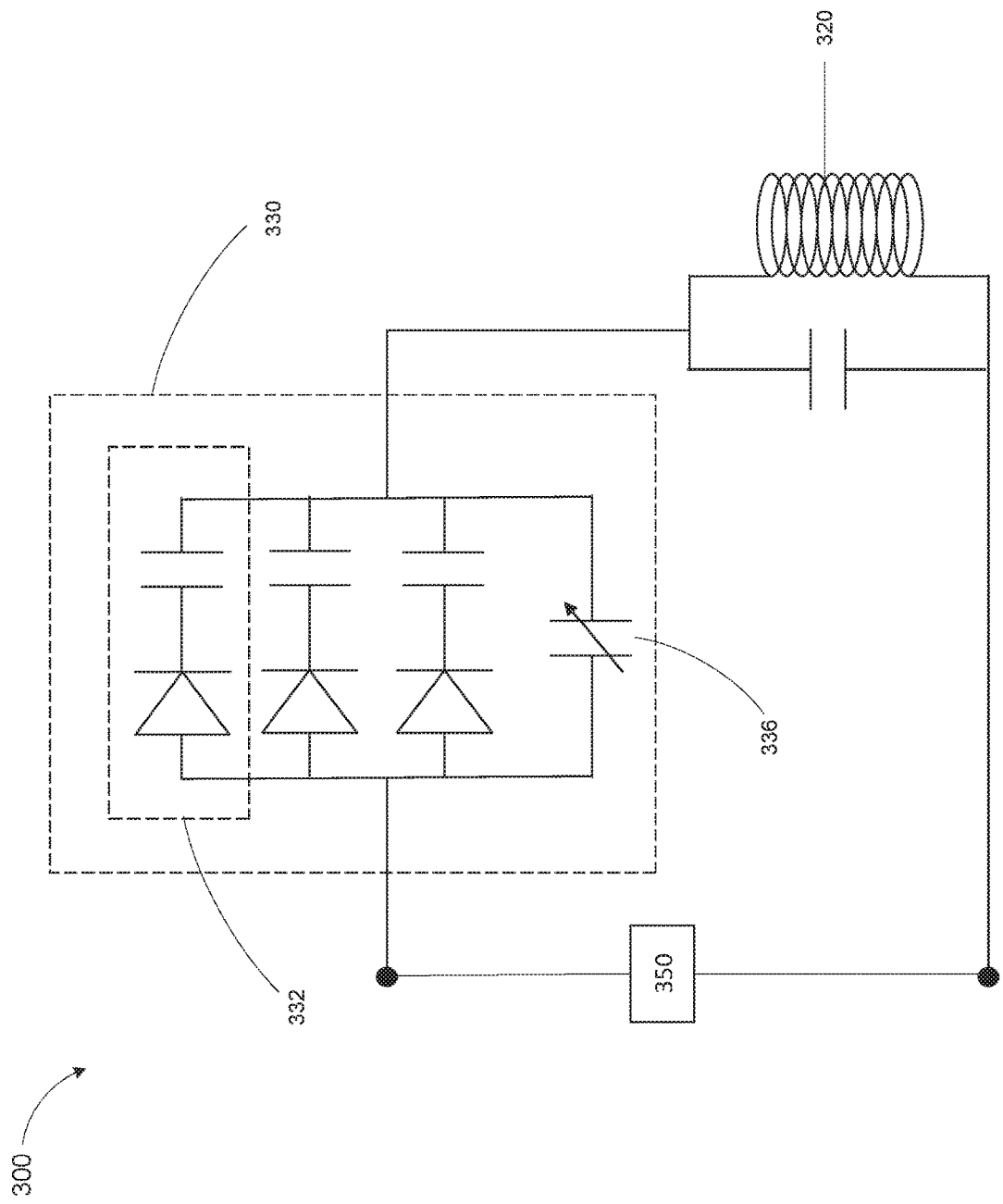
FIG. 3 is a schematic illustration of a circuit diagram of a magnetic imaging apparatus, according to various embodiments.

FIG. 3 is a schematic illustration of an example circuit diagram 300 of a magnetic imaging apparatus, according to various embodiments. As shown in FIG. 3, the circuit diagram 300 shows an RF coil 320 that is connected to a power source 350 and a tuning circuit 330 that includes a few sets of a PIN diode and a capacitor in series 332 and a varactor 336. The circuit diagram 300 is included herein for illustrative purposes, and therefore, is a non-limiting example, and any circuit suitable for driving the coil 320 can be used for scanning any desired frequency ranges. In various implementations described herein, each of the tuning elements in the circuit diagram 300 can be controlled by an external signal allowing for the bandwidth and center frequency of the RF-TX to be adjusted electronically. For example, one or more series 332 can be turned on or off to change the center frequency and the bandwidth.

Figures 4A, 4B:
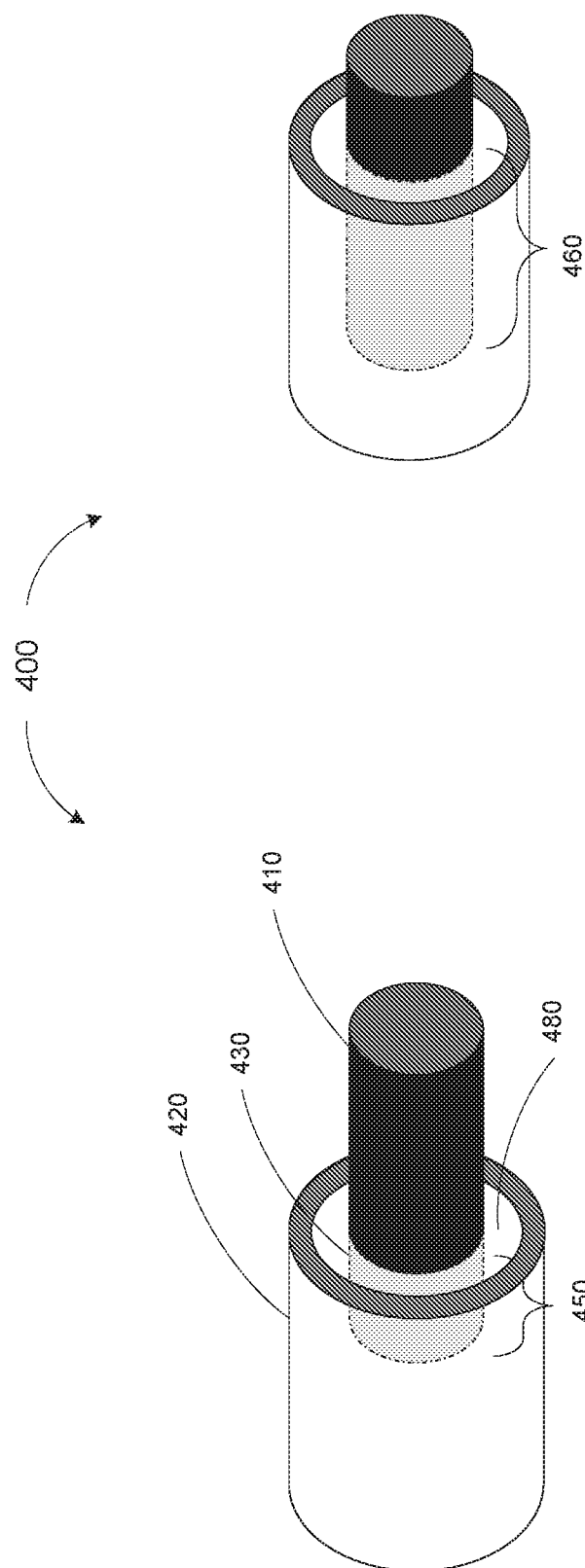
FIGS. 4A and 4B are schematic illustrations of the overlapping coil rungs used to adjust tuning using capacitive overlap, according to various embodiments.

FIGS. 4A and 4B are schematic illustrations of the overlapping coil rungs used to adjust tuning using capacitive overlap, according to various embodiments. As shown in FIG. 4, the overlapping rung system 400 includes an inner rung 410 and an outer rung 420 that are coaxial and concentric. In various implementations, the rungs 410 and 420 are connected to, for example, the rings 122 and 124, shown in FIG. 1. In various implementations, the inner rung 410 can be a solid tube or a hollow tube, and the outer rung 420 is a hollow tube to accommodate the inner rung 410, for example, to slide in and out. In various implementations, the system 400 can be tuned by dynamically tuning the amount of overlap 430 between the rungs 410 and 420. FIG. 4A illustrates an amount of overlap 450 whereas FIG. 4B illustrate an amount of overlap 460. By adjusting the spatial separation of the two rings (e.g., rings 122 and 124), the amount of overlap 430 between the two rungs 410 and 420 can be changed as shown going from 450 to 460. The change in spatial overlap 450 and 470 will cause a change in capacitance of the rung system 400 allowing for a change in the resonant frequency of the structure.

In various implementations, the overlapped rungs 410 and 420 include a separation layer 480, which may include air or any other suitable dielectric materials. In various implementations, the separation layer 480 may include a cooling layer of material. In various implementations, the cooling layer of material can include a ceramic, a flowing high heat capacity fluid or gas, or a flowing cryogenic fluid or gas.

Figure 5B:
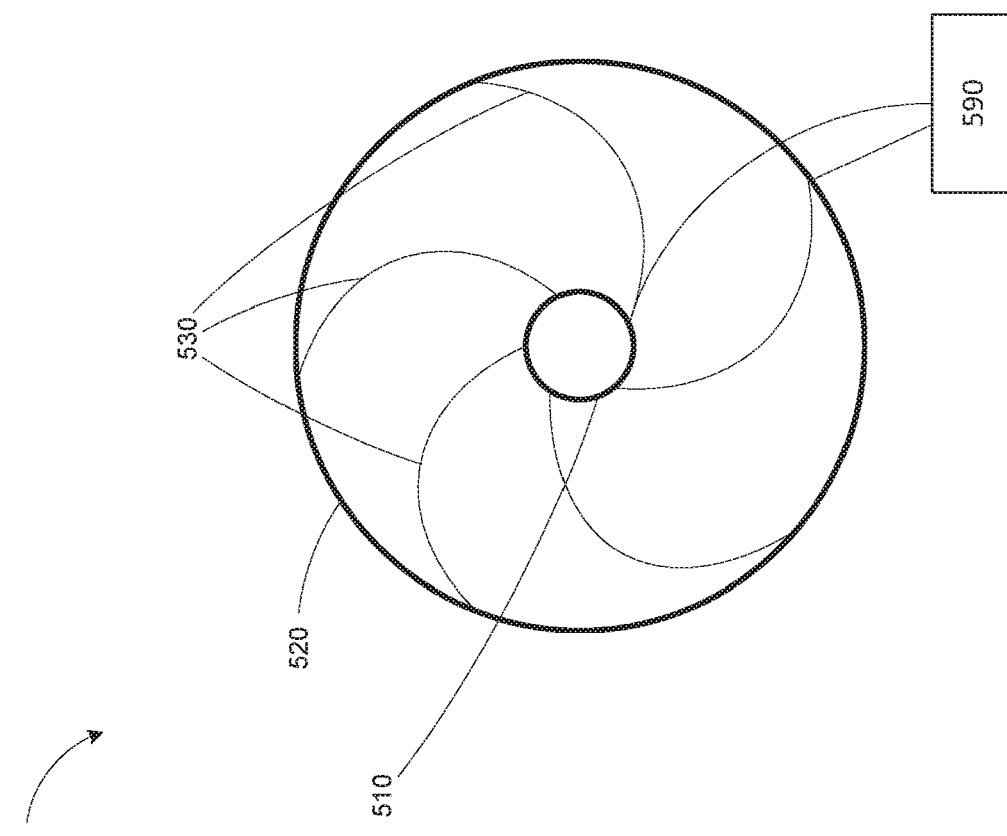
FIGS. 5A and 5B illustrate schematic views of an implementation of a magnetic imaging apparatus, according to various embodiments.
Figure 5A:
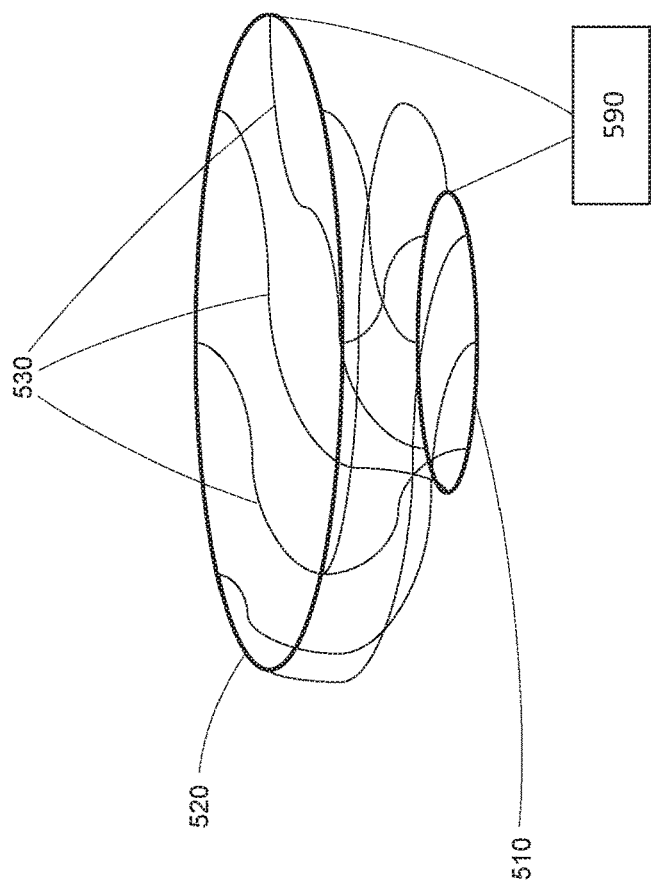

FIGS. 5A and 5B illustrate schematic side view and top view, respectively, of an implementation of a magnetic imaging apparatus 500, according to various embodiments. As shown in FIGS. 5A and 5B, the apparatus 500 is a radio frequency transmission (RF-TX) coil that projects the RF power outwards away from the coil itself. As shown in FIGS. 5A and 5B, the apparatus 500 is connected to a power source 590 that is configured to flow current through the apparatus 500 to generate an electromagnetic field in a region of interest. In accordance with various embodiments, the power source 590 is similar to the power source 150 (e.g., power source 150a and/or power source 150b) as shown and described with respect to FIG. 1. The apparatus 500 is substantially similar to the coil 120 as shown and described with respect to FIG. 1. Similar to the coil 120, which includes the first ring 122 and the second ring 124 that are connected by one or more rungs 126, the apparatus 500 is a radio frequency transmission coil that has a first ring 510 and a second ring 520 that are connected by one or more rungs 530. The rings 510 and 520 are the same as rings 122 and 124, and thus will not be described in further detail.

Similar to the coil 120, the apparatus 500 can be connected to a power source to project a uniform RF field within a field of view. Similar to the apparatus of FIG. 1, the field of view generated by the apparatus 500 can include a region of interest for magnetic resonance imaging (i.e., imaging region), and therefore is suitable for use in a single-sided magnetic resonance imaging system. Similar to the coil 120, the apparatus 500 can be configured to include one or more electronic components for tuning the magnetic field. The one or more electronic components can include a varactor, a PIN diode, a capacitor, or a switch, including a micro-electromechanical system (MEMS) switch, a solid state relay, or a mechanical relay. In various implementations, the apparatus 500 can be configured to include any of the one or more electronic components along the electrical circuit. In various implementations, the one or more components can include mu metals, dielectrics, magnetic, or metallic components not actively conducting electricity and can tune the coil. In various implementations, the one or more electronic components used for tuning includes at least one of dielectrics, conductive metals, metamaterials, or magnetic metals. In various implementations, tuning the electromagnetic field includes changing the current or by changing physical locations of the one or more electronic components. In various implementations, the apparatus 500 is cryogenically cooled to reduce resistance and improve efficiency. In various implementations, the first ring and the second ring comprise a plurality of windings or litz wires.

In FIG. 1, the rungs 126 of the coil 120 are shown as simple rungs that connect the ring 122 and the ring 124 at their closest respective positions. In FIGS. 5A and 5B, the rungs 530 are configured to connect the ring 510 and ring 520 at positions that are not the closest points on the rings 510 and 520. In accordance with some embodiments, the rungs 530 are comparatively longer than the rungs 126 of FIG. 1 since the connection points are farther away than those shown in FIG. 1.

As shown in FIG. 5B, the rungs 530, together with the rings 510 and 520 form a helical shape coil. In accordance with various embodiments, the shape of the apparatus 500 effectively creates a radio frequency field that adjusts the shape of the magnetic field during operation. In accordance with various embodiments, although the apparatus 500 is shown with only five rungs 530, the apparatus 500 can include any number of rungs in order to create a desired radio frequency field strength and/or uniformity. In accordance with various embodiments, although the apparatus 500 is shown with the ring 510 and 520 having a certain dimension, the dimensions of rings 510 and 520 can be the same as those of the rings 122 and 124, as shown and described with respect to FIG. 1.

In various implementations, the apparatus 500 includes the ring 510 and the ring 520 that are positioned co-axially along the same axis but at a distance away from each other, as shown in FIGS. 5A and 5B. In various implementations, the ring 510 and the ring 520 are separated by a distance ranging from about 0.1 m to about 10 m. In various implementations, the ring 510 and the ring 520 are separated by a distance ranging from about 0.2 m to about 5 m, about 0.3 m to about 2 m, about 0.2 m to about 1 m, about 0.1 m to about 0.8 m, or about 0.1 m to about 1 m, inclusive of any separation distance therebetween. In various implementations, the apparatus 500 includes the ring 510 and the ring 520 that are positioned non-co-axially but along the same direction and separated at a distance ranging from about 0.2 m to about 5 m. In various implementations, the ring 510 and the ring 520 can also be tilted with respect to each other. In various implementations, the tilt angle can be from 1 degree to 90 degrees, from 1 degree to 5 degrees, from 5 degrees to 10 degrees, from 10 degrees to 25 degrees, from 25 degrees to 45 degrees, and from 45 degrees to 90 degrees.

In various implementations, the ring 510 and the ring 520 have the same diameter. In various implementations, the ring 510 and the ring 520 have different diameters and the ring 520 has a larger diameter than the ring 510, as shown in FIGS. 5A and 5B. In various implementations, the ring 510 and the ring 520 of the apparatus 500 are configured to create an imaging region that contains a uniform RF power profile within a field of view that is not centered within the apparatus 500 and is instead projected outwards in space from the coil itself.

In various implementations, the ring 510 has a diameter between about 10 μm and about 10 m. In various implementations, the ring 510 has a diameter between about 0.001 m and about 9 m, between about 0.01 m and about 8 m, between about 0.03 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any diameter therebetween.

In various implementations, the ring 520 has a diameter between about 10 μm and about 10 m. In various implementations, the ring 520 has a diameter between about 0.001 m and about 9 m, between about 0.01 m and about 8 m, between about 0.03 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any diameter therebetween.

In various implementations, the ring 510 and the ring 520 are not circular and can instead have a cross section that is elliptical, square, rectangular, or trapezoidal, or any shape or form having a closed loop. In various implementations, the ring 510 and the ring 520 may have cross sections that vary in two different axial planes with the primary axis being a circle and the secondary axis having a sinusoidal shape or some other geometric shape. In various implementations, the apparatus 500 may include more than two rings, i.e., the ring 510 and the ring 520, each connected by rungs 530 that span and connect all the rings. In various implementations, the apparatus 500 may include more than the ring 510 and the ring 520, each connected by rungs that alternate connection points between rings. In various implementations, the ring 510 may contain a physical aperture for access. In various implementations, the ring 510 may be a solid sheet without a physical aperture.

In various implementations, the apparatus 500 can be configured to generate an electromagnetic field (also referred to herein as "magnetic field") strength between about 1 µT and about 10 mT. In various implementations, the apparatus 500 can generate a magnetic field strength between about 10 µT and about 5 mT, about 50 µT and about 1 mT, or about 100 µT and about 1 mT, inclusive of any magnetic field strength therebetween.

In various implementations, the apparatus 500 can be configured to generate an electromagnetic field that is pulsed at a radio frequency between about 1 kHz and about 2 GHz. In various implementations, the apparatus 500 can be configured to generate a magnetic field that is pulsed at a radio frequency between about 1 kHz and about 1 GHz, about 10 kHz and about 800 MHz, about 50 kHz and about 300 MHz, about 100 kHz and about 100 MHz, about 10 kHz and about 10 MHz, about 10 kHz and about 5 MHz, about 1 kHz and about 2 MHz, about 50 kHz and about 150 kHz, about 80 kHz and about 120 kHz, about 800 kHz and about 1.2 MHz, about 100 kHz and about 10 MHz, or about 1 MHz and about 5 MHz, inclusive of any frequencies therebetween.

In various implementations, the apparatus 500 is oriented to partially surround the region of interest. In various implementations, the ring 510, the ring 520, and the one or more rungs 530 are non-planar to each other. Said another way, the ring 510, the ring 520, and the one or more rungs 530 form a three-dimensional structure that surrounds the region of interest where a patient resides. In various implementations, the ring 510 is closer to the region of interest than the ring 520. In various implementations, the region of interest has a size of about 0.1 m to about 1 m. In various implementations, the region of interest is smaller than the diameter of the ring 510. In various implementations, the region of interest is smaller than both the diameter of the ring 520 and the diameter of the ring 510. In various implementations, the region of interest has a size that is smaller than the diameter of the ring 510 and larger than the diameter of the ring 520.

In various implementations, the ring 510, the ring 520, or the one or more rungs 530 include the same material. In various implementations, the ring 510, the ring 520, or the one or more rungs 530 include different materials. In various implementations, the ring 510, the ring 520, or the one or more rungs 530 include hollow tubes or solid tubes. In various implementations, the hollow tubes or solid tubes can be configured for air or fluid cooling. In various implementations, each of the ring 510, the ring 520, or the one or more rungs 530 includes one or more electrically conductive windings. In various implementations, the windings include litz wires or any electrical conducting wires. These additional windings could be used to improve performance by lowering the resistance of the windings at the desired frequency. In various implementations, the ring 510, the ring 520, or the one or more rungs 530 include copper, aluminum, silver, silver paste, or any high electrical conducting material, including metal, alloys or superconducting metal, alloys or non-metal. In various implementations, the ring 510, the ring 520, or the one or more rungs 530 may include metamaterials.

In various implementations, the ring 510, the ring 520, or the one or more rungs 530 may contain separate electrically non-conductive thermal control channels designed to maintain the temperature of the structure to a specified setting. In various implementations, the thermal control channels can be made from electrically conductive materials and integrated as to carry the electrical current.

Figure 6:
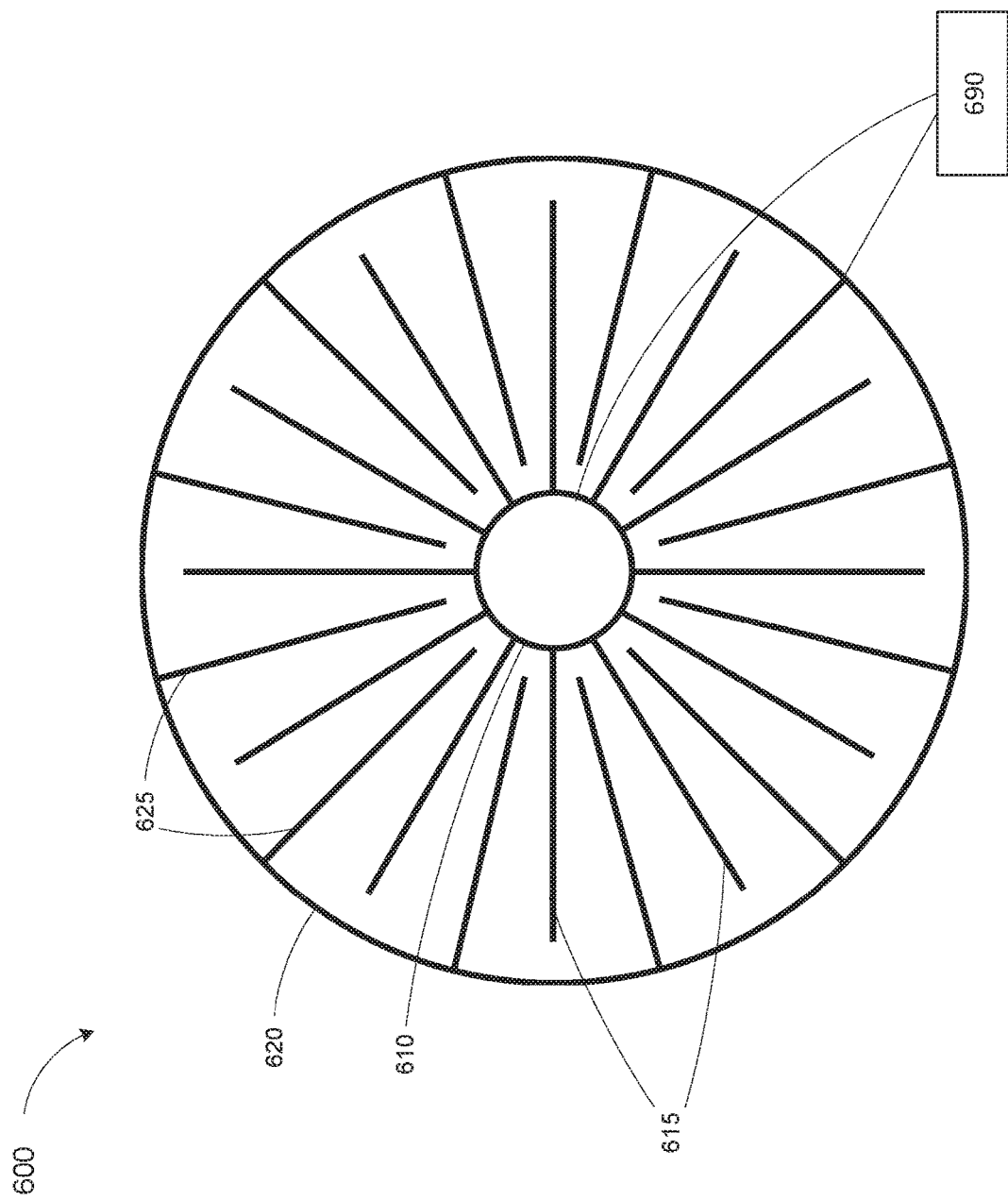
FIG. 6 is a schematic view of an implementation of a magnetic imaging apparatus, according to various embodiments.

FIG. 6 is a schematic view of an implementation of a magnetic imaging apparatus 600, according to various embodiments. As shown in FIG. 6, the apparatus 600 is a radio frequency transmission (RF-TX) coil that projects the RF power outwards away from the coil itself. As shown in FIG. 6, the apparatus 600 is connected to a power source 690 that is configured to flow current through the apparatus 600 to generate an electromagnetic field in a region of interest.

FIG. 6 illustrates a top view of the apparatus 600, similar to the apparatus 500 of FIG. 5B. The apparatus 600 is similar to the coil 120 as shown and described with respect to FIG. 1. Similar to the coil 120, which includes the first ring 122 and the second ring 124, the apparatus 600 includes an inner ring 610 and an outer ring 620. The rings 610 and 620 are the same as rings 122 and 124, and thus will not be described in further detail. Unlike the coil 120, which includes the first ring 122 and the second ring 124 that are connected by one or more rungs 126, or the apparatus 500 which includes the first ring 510 and the second ring 520 that are connected by one or more rungs 530, the apparatus 600 do not include connecting rungs. Instead, as shown in FIG. 6, the inner ring 610 includes one or more rungs 615, and the outer ring 620 that includes one or more rungs 625. As shown in FIG. 6, the one or more rungs 615 are pointing outward whereas the one or more rungs 625 are pointing inward.

In accordance with various embodiments, the power source 690 can be connected to the apparatus 600 in a few places, for example, between the inner ring 610 and the outer ring 620. In accordance with various embodiments, the power source 690 can be connected to the apparatus 600 via the one or more rungs 625 and the one or more rungs 615. In accordance with various embodiments, the power source 690 can be connected to the apparatus 600 across a capacitor that is inserted into any of the inner ring 610 and/or the outer ring 620. In various implementations, the apparatus 600 can be wirelessly powered using another coil that is inductively coupled to the apparatus 600, for example, without establishing a direct connection to the apparatus 600.

In accordance with some embodiments, the interdigitating rungs 615 and 625 are not in physical contact but only in electrical contact via capacitive effect due to the placement of the interdigitating rungs 615 and 625. In accordance with some embodiments, the interdigitating rungs 615 and 625 (also referred to herein as "millipede coil" configuration) are configured to form a capacitance in between the interdigitating rungs 615 and 625, whereby the capacitance can be changed or adjusted by changing the parameters of the interdigitating rungs 615 and 625. For example, by moving the interdigitating rungs 615 and 625 to closer to each other, the distance between adjacent sets of the interdigitating rungs 615 and 625 can be changed. The changing distance of the interdigitating rungs 615 and 625 will lead to changes in the capacitance of the apparatus 600. As a result, in accordance with various embodiments, the interdigitating rungs 615 and 625 can be figured to tune a resonance frequency of the apparatus 600 by changing the capacitance associated with the interdigitating rungs 615 and 625.

In addition, the apparatus 600 can be configured to include one or more electronic components for tuning the resonance frequency of the magnetic field. The one or more electronic components can include a varactor, a PIN diode, a capacitor, or a switch, including a micro-electro-mechanical system (MEMS) switch, a solid state relay, or a mechanical relay. In various implementations, the apparatus 600 can be configured to include any of the one or more electronic components along the electrical circuit. In various implementations, the one or more components can include mu metals, dielectrics, magnetic, or metallic components not actively conducting electricity and can tune the coil. In various implementations, the one or more electronic components used for tuning includes at least one of dielectrics, conductive metals, metamaterials, or magnetic metals. In various implementations, tuning the electromagnetic field includes changing the current or by changing physical locations of the one or more electronic components. In various implementations, the apparatus 600 is cryogenically cooled to reduce resistance and improve efficiency. In various implementations, the first ring and the second ring comprise a plurality of windings or litz wires.

In various implementations, the apparatus 600 includes the ring 610 and the ring 620 that are positioned co-axially along the same axis (coming out of the page), as shown in FIG. 6. In various implementations, the ring 610 and the ring 620 are separated by a distance ranging from about 0.1 m to about 10 m. In various implementations, the ring 610 and the ring 620 are separated by a distance ranging from about 0.2 m to about 5 m, about 0.3 m to about 2 m, about 0.2 m to about 1 m, about 0.1 m to about 0.8 m, or about 0.1 m to about 1 m, inclusive of any separation distance therebetween. In various implementations, the apparatus 600 includes the ring 610 and the ring 620 that are positioned non-co-axially but along the same direction and separated at a distance ranging from about 0.2 m to about 5 m. In various implementations, the ring 610 and the ring 620 can also be tilted with respect to each other. In various implementations, the tilt angle can be from 1 degree to 90 degrees, from 1 degree to 5 degrees, from 5 degrees to 10 degrees, from 10 degrees to 25 degrees, from 25 degrees to 45 degrees, and from 45 degrees to 90 degrees.

In various implementations, the ring 610 and the ring 620 have the same diameter. In various implementations, the ring 610 and the ring 620 have different diameters and the ring 620 has a larger diameter than the ring 610, as shown in FIG. 6. In various implementations, the ring 610 and the ring 620 of the apparatus 600 are configured to create an imaging region that contains a uniform RF power profile within a field of view that is not centered within the apparatus 600 and is instead projected outwards in space from the coil itself.

In various implementations, the ring 610 has a diameter between about 10 μm and about 10 m. In various implementations, the ring 610 has a diameter between about 0.001 m and about 9 m, between about 0.01 m and about 8 m, between about 0.03 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any diameter therebetween.

In various implementations, the ring 620 has a diameter between about 10 μm and about 10 m. In various implementations, the ring 620 has a diameter between about 0.001 m and about 9 m, between about 0.01 m and about 8 m, between about 0.03 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any diameter therebetween.

In various implementations, the ring 610 and the ring 620 are not circular and can instead have a cross section that is elliptical, square, rectangular, or trapezoidal, or any shape or form having a closed loop. In various implementations, the ring 610 and the ring 620 may have cross sections that vary in two different axial planes with the primary axis being a circle and the secondary axis having a sinusoidal shape or some other geometric shape. In various implementations, the ring 610 may contain a physical aperture for access. In various implementations, the ring 610 may be a solid sheet without a physical aperture.

In various implementations, the apparatus 600 can be configured to generate an electromagnetic field (also referred to herein as "magnetic field") strength between about 1 μT and about 10 mT. In various implementations, the apparatus 600 can generate a magnetic field strength between about 10 μT and about 5 mT, about 50 μT and about 1 mT, or about 100 μT and about 1 mT, inclusive of any magnetic field strength therebetween.

In various implementations, the apparatus 600 can be configured to generate an electromagnetic field that is pulsed at a radio frequency between about 1 kHz and about 2 GHz. In various implementations, the apparatus 600 can be configured to generate a magnetic field that is pulsed at a radio frequency between about 1 kHz and about 1 GHz, about 10 kHz and about 800 MHz, about 50 kHz and about 300 MHz, about 100 kHz and about 100 MHz, about 10 kHz and about 10 MHz, about 10 kHz and about 5 MHz, about 1 kHz and about 2 MHz, about 50 kHz and about 150 kHz, about 80 kHz and about 120 kHz, about 800 kHz and about 1.2 MHz, about 100 kHz and about 10 MHz, or about 1 MHz and about 5 MHz, inclusive of any frequencies therebetween.

In various implementations, the apparatus 600 is oriented to partially surround the region of interest. In various implementations, the ring 610, the ring 620, and the one or more rungs 630 are non-planar to each other. Said another way, the ring 610, the ring 620, and the one or more rungs 630 form a three-dimensional structure that surrounds the region of interest where a patient resides. In various implementations, the ring 610 is closer to the region of interest than the ring 620. In various implementations, the region of interest has a size of about 0.1 m to about 1 m. In various implementations, the region of interest is smaller than the diameter of the ring 610. In various implementations, the region of interest is smaller than both the diameter of the ring 620 and the diameter of the ring 610. In various implementations, the region of interest has a size that is smaller than the diameter of the ring 610 and larger than the diameter of the ring 620.

In various implementations, the ring 610, the ring 620, or the one or more rungs 630 include the same material. In various implementations, the ring 610, the ring 620, or the one or more rungs 630 include different materials. In various implementations, the ring 610, the ring 620, or the one or more rungs 630 include hollow tubes or solid tubes. In various implementations, the hollow tubes or solid tubes can be configured for air or fluid cooling. In various implementations, each of the ring 610, the ring 620, or the one or more rungs 630 includes one or more electrically conductive windings. In various implementations, the windings include litz wires or any electrical conducting wires. These additional windings could be used to improve performance by lowering the resistance of the windings at the desired frequency. In various implementations, the ring 610, the ring 620, or the one or more rungs 630 include copper, aluminum, silver, silver paste, or any high electrical conducting material, including metal, alloys or superconducting metal, alloys or non-metal. In various implementations, the ring 610, the ring 620, or the one or more rungs 630 may include metamaterials.

In various implementations, the ring 610, the ring 620, or the one or more rungs 630 may contain separate electrically non-conductive thermal control channels designed to maintain the temperature of the structure to a specified setting. In various implementations, the thermal control channels can be made from electrically conductive materials and integrated as to carry the electrical current.

Figure 7C:
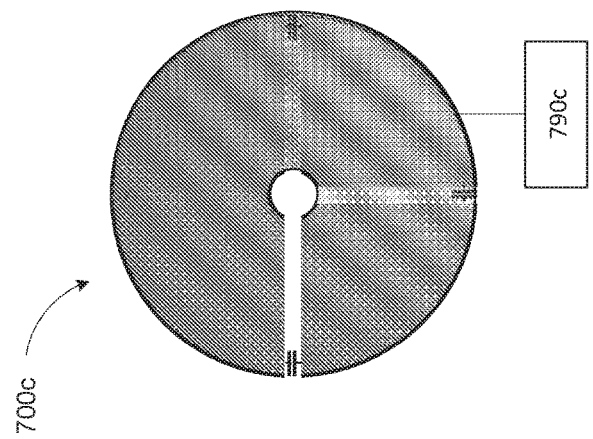
FIG. 7C is a schematic view of an implementation of a magnetic imaging apparatus, according to various embodiments.
Figure 7B:
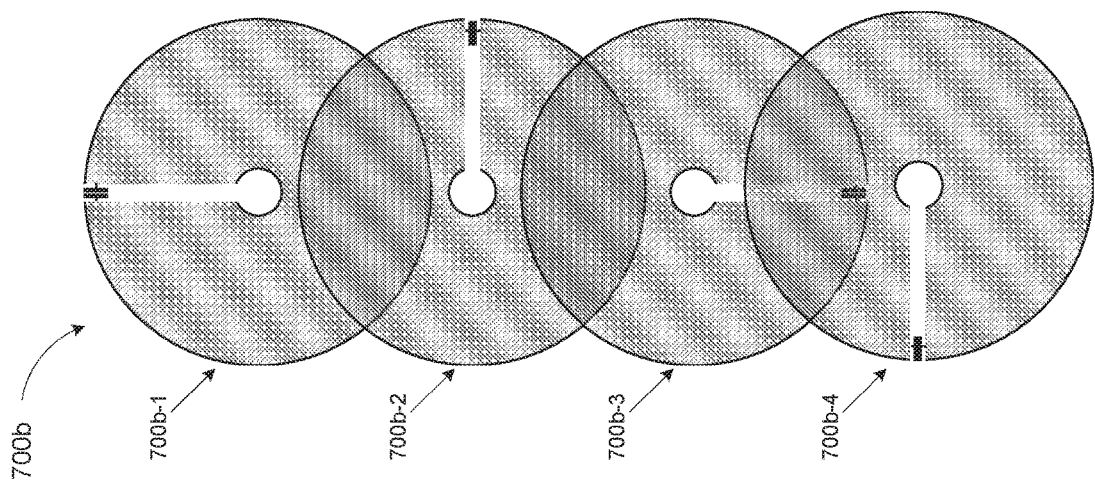
FIG. 7B is a schematic view of an implementation of a magnetic imaging apparatus, according to various embodiments.
Figure 7A:
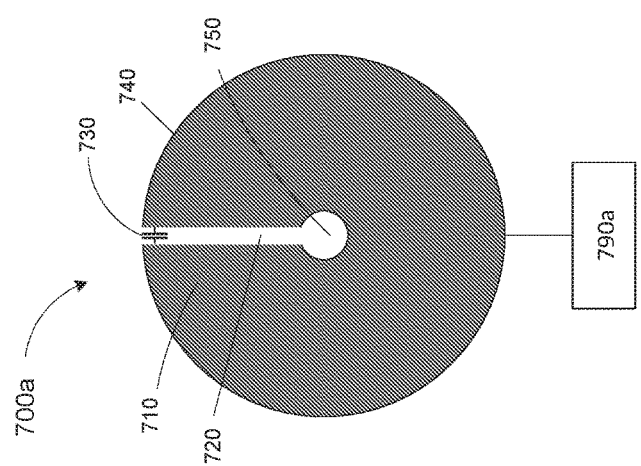
FIG. 7A is a schematic view of an implementation of a magnetic imaging apparatus, according to various embodiments.

FIG. 7A is a schematic view of an implementation of a magnetic imaging apparatus 700a, according to various embodiments. As shown in FIG. 7A, the apparatus 700a is a coil comprising a solid sheet of conductive metal 710. As shown in FIG. 7A, the apparatus 700a is connected to a power source 790a that is configured to flow current through the apparatus 700a to generate an electromagnetic field in a region of interest.

FIG. 7A illustrates a top view of the apparatus 700a, similar to the apparatus 500 of FIG. 5B and the apparatus 600 of FIG. 6. The apparatus 700a includes a slit 720 formed within the solid sheet of conductive metal 710. As shown in FIG. 7A, the apparatus 700a also includes a tuning element 730 within the slit 720. In accordance with various embodiments, the solid sheet of conductive metal 710 is configured for creating an equal distribution of radio frequency power across the region of interest. In accordance with various embodiments, the tuning element 730 is configured to tune the resonance frequency of the apparatus 700a.

In accordance with various embodiments, the power source 790a can be connected to the apparatus 700a in across the tuning element 730, such as a capacitor. In various implementations, the apparatus 700a can be wirelessly powered using another coil that is inductively coupled to the apparatus 700a, for example, without establishing a direct connection to the apparatus 700a.

In accordance with various embodiments, the tuning element 730 can include one or more electronic components for tuning the resonance frequency of the magnetic field. The one or more electronic components can include a varactor, a PIN diode, a capacitor, or a switch, including a micro-electro-mechanical system (MEMS) switch, a solid state relay, or a mechanical relay. In various implementations, the apparatus 700a can be configured to include any of the one or more electronic components along the electrical circuit. In various implementations, the one or more components can include mu metals, dielectrics, magnetic, or metallic components not actively conducting electricity and can tune the coil. In various implementations, the one or more electronic components used for tuning includes at least one of dielectrics, conductive metals, metamaterials, or magnetic metals. In various implementations, tuning the electromagnetic field includes changing the current or by changing physical locations of the one or more electronic components. In various implementations, the apparatus 700a is cryogenically cooled to reduce resistance and improve efficiency. In various implementations, the first ring and the second ring comprise a plurality of windings or litz wires.

In various implementations, the apparatus 700a has a diameter between about 10 μm and about 10 m. In various implementations, the apparatus 700a has a diameter between about 0.001 m and about 9 m, between about 0.01 m and about 8 m, between about 0.03 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any diameter therebetween.

In various implementations, the apparatus 700a has an outer edge 740 that is not circular and can instead have a cross section that is elliptical, square, rectangular, or trapezoidal, or any shape or form having a closed loop. In various implementations, the outer edge 740 has a diameter between about 10 μm and about 10 m. In various implementations, the outer edge 740 has a diameter between about 0.001 m and about 9 m, between about 0.01 m and about 8 m, between about 0.03 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any diameter therebetween.

In various implementations, the apparatus 700a contains a physical aperture 750 for access, as shown in FIG. 7A. In various implementations, the physical aperture 750 has an opening between about 10 μm and about 1 m. In various implementations, the physical aperture 750 has an opening between about 0.001 m and about 0.9 m, between about 0.01 m and about 0.8 m, between about 0.03 m and about 0.6 m, between about 0.05 m and about 0.5 m, between about 0.05 m and about 0.3 m, between about 0.05 m and about 0.2 m, between about 0.1 m and about 0.2 m, between about 0.05 m and about 0.1 m, or between about 0.01 m and about 0.1 m, inclusive of any diameter therebetween.

In various implementations, the apparatus 700a may be a solid sheet without a physical aperture.

In various implementations, the apparatus 700a can be configured to generate an electromagnetic field (also referred to herein as "magnetic field") strength between about 1 μT and about 10 mT. In various implementations, the apparatus 700a can generate a magnetic field strength between about 10 μT and about 5 mT, about 50 μT and about 1 mT, or about 100 μT and about 1 mT, inclusive of any magnetic field strength therebetween.

In various implementations, the apparatus 700a can be configured to generate an electromagnetic field that is pulsed at a radio frequency between about 1 kHz and about 2 GHz. In various implementations, the apparatus 700a can be configured to generate a magnetic field that is pulsed at a radio frequency between about 1 kHz and about 1 GHz, about 10 kHz and about 800 MHz, about 50 kHz and about 300 MHz, about 100 kHz and about 100 MHz, about 10 kHz and about 10 MHz, about 10 kHz and about 5 MHz, about 1 kHz and about 2 MHz, about 50 kHz and about 150 kHz, about 80 kHz and about 120 kHz, about 800 kHz and about 1.2 MHz, about 100 kHz and about 10 MHz, or about 1 MHz and about 5 MHz, inclusive of any frequencies therebetween.

In various implementations, the apparatus 700a is oriented to partially surround the region of interest. In various implementations, the apparatus 700a is a non-planar three-dimensional structure that surrounds the region of interest where a patient resides. In various implementations, the apparatus 700a has a shape of a funnel with the solid sheet of conductive metal 710 connecting the two openings, i.e., the outer edge 740 and the physical aperture 750. In various implementations, in side view, the solid sheet of conductive metal 710 is a straight line, resembling the shape of a funnel. In various implementations, in side view, the solid sheet of conductive metal 710 may include a curve surface (or shown as a curve line in two-dimensional side view), resembling a hemispherical bowl shape.

In various implementations, the solid sheet of conductive metal 710 of the apparatus 700a may include one or more hollow portions within the solid sheet of conductive metal 710. In various implementations, the one or more hollow portions can be configured for air or fluid cooling. In various implementations, the solid sheet of conductive metal 710 can include copper, aluminum, silver, silver paste, or any high electrical conducting material, including metal, alloys or superconducting metal, alloys or non-metal. In various implementations, the solid sheet of conductive metal 710 can may include metamaterials.

In various implementations, the solid sheet of conductive metal 710 may contain separate electrically non-conductive thermal control channels designed to maintain the temperature of the structure to a specified setting. In various implementations, the thermal control channels can be made from electrically conductive materials and integrated as to carry the electrical current.

FIG. 7B is a schematic view (top view) of an implementation of a magnetic imaging apparatus 700*b*, according to various embodiments. As shown in FIG. 7B, the apparatus 700*b* includes coils 700*b*-1, 700*b*-2, 700*b*-3, and 700*b*-4 that are stacked on top of each other. In accordance with various embodiments, each of the coils 700*b*-1, 700*b*-2, 700*b*-3, and 700*b*-4 are identical to the coil in apparatus 700*a* and therefore will not be described in further detail. In accordance with various embodiments, the coils 700*b*-1, 700*b*-2, 700*b*-3, and 700*b*-4 may include identical, substantially similar, or different slit dimensions and/or tuning elements. In accordance with various embodiments, the slit dimensions and/or tuning elements of each of the coils 700*b*-1, 700*b*-2, 700*b*-3, and 700*b*-4 allow the resonance frequency of the apparatus 700*b* to be tuned or selected.

As shown in FIG. 7B, the apparatus 700*b* includes the stacked coils 700*b*-1, 700*b*-2, 700*b*-3, and 700*b*-4 that are offset rotationally by 90 degrees to each other with respect to the slit or tuning elements. Although not shown in FIG. 7B, the apparatus 700*b* may include additional coils besides the shown coils 700*b*-1, 700*b*-2, 700*b*-3, and 700*b*-4. Although shown as offset by 90 degrees to each other, the coils 700*b*-1, 700*b*-2, 700*b*-3, and 700*b*-4 may be offset by a different angular amount in order to tune the desire resonant frequency.

FIG. 7C is a schematic view (top view) of an implementation of a magnetic imaging apparatus 700*c*, according to various embodiments. The apparatus 700*c* is an illustration of stacked coils 700*b*-1, 700*b*-2, 700*b*-3, and 700*b*-4 that are stacked directly on top of each other. As shown in FIG. 7C, the apparatus 700*c* is connected to a power source 790*c* that is configured to flow current through the apparatus 700*c* to generate an electromagnetic field in a region of interest.

In accordance with various embodiments, the power source 790*c* can be connected to the apparatus 700*c* in across the tuning element 730, such as a capacitor. In various implementations, the apparatus 700*c* can be wirelessly powered using another coil that is inductively coupled to the apparatus 700*c*, for example, without establishing a direct connection to the apparatus 700*c*.

Figure 8:
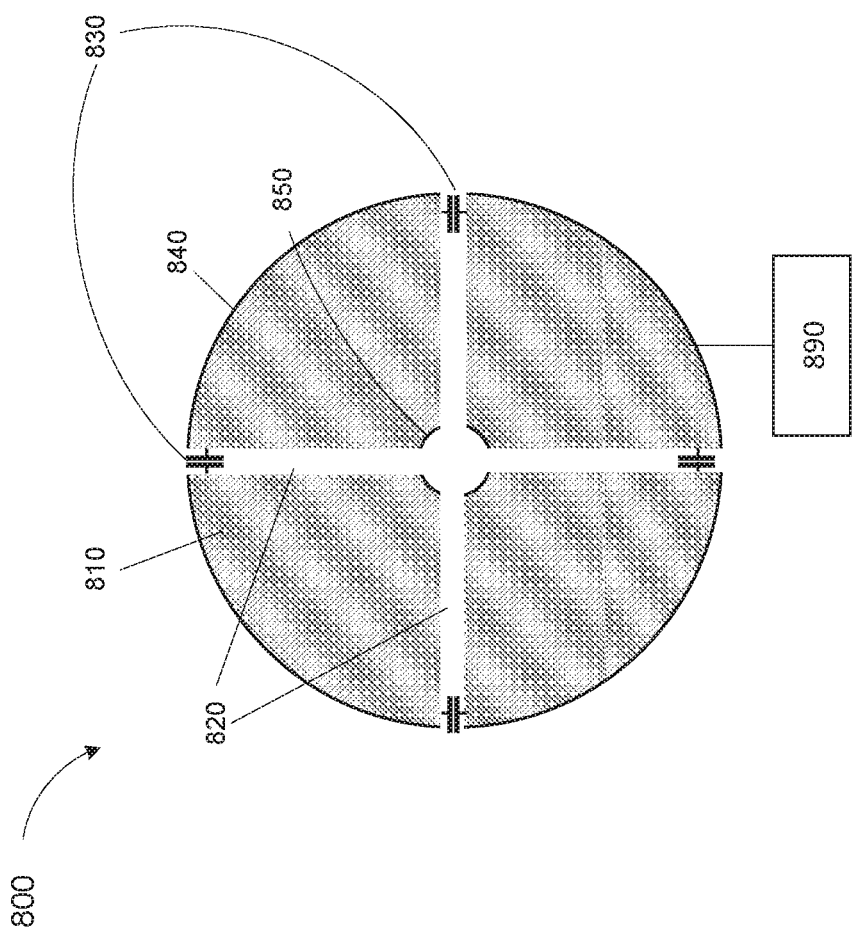
FIG. 8 is a schematic view of an implementation of a magnetic imaging apparatus, according to various embodiments.

FIG. 8 is a schematic view (top view) of an implementation of a magnetic imaging apparatus 800, according to various embodiments. As shown in FIG. 8, the apparatus 800 includes a coil comprising a solid sheet of conductive metal 810 wherein a plurality of slits 820 are formed within the solid sheet of conductive metal 810. As shown in FIG. 8, the apparatus 800 is also connected to a power source 890 that is configured to flow current through the apparatus 800 to generate an electromagnetic field in a region of interest.

As shown in FIG. 8, the apparatus 800 also includes a plurality of tuning elements 830 within the plurality of slits 820. In accordance with various embodiments, one or more tuning elements 830 can be included within each of the plurality of slits 820. As shown in FIG. 8, the apparatus 800 includes four slits 820 that are formed at every 90 degrees. Although not shown in FIG. 8, the apparatus 800 may include any number of slits 820 and thus accordingly change the angular distance between adjacent slits 820 so that the slits 820 are equally spaced from one another. In accordance with various embodiments, the number of slits 820 and the corresponding number of tuning elements 830 disposed therewithin can be configured to tune the desire resonant frequency of the apparatus 800.

In accordance with various embodiments, the power source 890 can be connected to the apparatus 800 in across any of the one or more tuning elements 830, such as a capacitor. In various implementations, the apparatus 800 can be wirelessly powered using another coil that is inductively coupled to the apparatus 800, for example, without establishing a direct connection to the apparatus 800.

In accordance with various embodiments, the apparatus 800 can be configured for creating an equal distribution of radio frequency power across the region of interest. In accordance with various embodiments, the plurality of tuning elements 830 can also be configured to tune the resonance frequency of the apparatus 800. In accordance with various embodiments, the plurality of tuning elements 830 can include one or more electronic components for tuning the resonance frequency of the magnetic field. The one or more electronic components can include a varactor, a PIN diode, a capacitor, or a switch, including a micro-electromechanical system (MEMS) switch, a solid state relay, or a mechanical relay. In various implementations, the apparatus 800 can be configured to include any of the one or more electronic components along the electrical circuit. In various implementations, the one or more components can include mu metals, dielectrics, magnetic, or metallic components not actively conducting electricity and can tune the coil. In various implementations, the one or more electronic components used for tuning includes at least one of dielectrics, conductive metals, metamaterials, or magnetic metals. In various implementations, tuning the electromagnetic field includes changing the current or by changing physical locations of the one or more electronic components. In various implementations, the apparatus 800 is cryogenically cooled to reduce resistance and improve efficiency. In various implementations, the first ring and the second ring comprise a plurality of windings or litz wires.

In various implementations, the apparatus 800 has a diameter between about 10 μm and about 10 m. In various implementations, the apparatus 800 has a diameter between about 0.001 m and about 9 m, between about 0.01 m and about 8 m, between about 0.03 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any diameter therebetween.

In various implementations, the apparatus 800 has an outer edge 840 that is not circular and can instead have a cross section that is elliptical, square, rectangular, or trapezoidal, or any shape or form having a closed loop. In various implementations, the outer edge 840 has a diameter between about 10 μm and about 10 m. In various implementations, the outer edge 840 has a diameter between about 0.001 m and about 9 m, between about 0.01 m and about 8 m, between about 0.03 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any diameter therebetween.

In various implementations, the apparatus 800 contains a physical aperture 850 for access, as shown in FIG. 8. In various implementations, the physical aperture 850 has an opening between about 10 µm and about 1 m. In various implementations, the physical aperture 850 has an opening between about 0.001 m and about 0.9 m, between about 0.01 m and about 0.8 m, between about 0.03 m and about 0.6 m, between about 0.05 m and about 0.5 m, between about 0.05 m and about 0.3 m, between about 0.05 m and about 0.2 m, between about 0.1 m and about 0.2 m, between about 0.05 m and about 0.1 m, or between about 0.01 m and about 0.1 m, inclusive of any diameter therebetween.

In various implementations, the apparatus 800 may be a solid sheet without a physical aperture.

In various implementations, the apparatus 800 can be configured to generate an electromagnetic field (also referred to herein as "magnetic field") strength between about 1 µT and about 10 mT. In various implementations, the apparatus 800 can generate a magnetic field strength between about 10 µT and about 5 mT, about 50 µT and about 1 mT, or about 100 µT and about 1 mT, inclusive of any magnetic field strength therebetween.

In various implementations, the apparatus 800 can be configured to generate an electromagnetic field that is pulsed at a radio frequency between about 1 kHz and about 2 GHz. In various implementations, the apparatus 800 can be configured to generate a magnetic field that is pulsed at a radio frequency between about 1 kHz and about 1 GHz, about 10 kHz and about 800 MHz, about 50 kHz and about 300 MHz, about 100 kHz and about 100 MHz, about 10 kHz and about 10 MHz, about 10 kHz and about 5 MHz, about 1 kHz and about 2 MHz, about 50 kHz and about 150 kHz, about 80 kHz and about 120 kHz, about 800 kHz and about 1.2 MHz, about 100 kHz and about 10 MHz, or about 1 MHz and about 5 MHz, inclusive of any frequencies therebetween.

In various implementations, the apparatus 800 is oriented to partially surround the region of interest. In various implementations, the apparatus 800 is a non-planar three-dimensional structure that surrounds the region of interest where a patient resides. In various implementations, the apparatus 800 has a shape of a funnel with the solid sheet of conductive metal 810 connecting the two openings, i.e., the outer edge 840 and the physical aperture 850. In various implementations, in side view, the solid sheet of conductive metal 810 is a straight line, resembling the shape of a funnel. In various implementations, in side view, the solid sheet of conductive metal 810 may include a curve surface (or shown as a curve line in two-dimensional side view), resembling a hemispherical bowl shape.

In various implementations, the solid sheet of conductive metal 810 of the apparatus 800 may include one or more hollow portions within the solid sheet of conductive metal 810. In various implementations, the one or more hollow portions can be configured for air or fluid cooling. In various implementations, the solid sheet of conductive metal 810 can include copper, aluminum, silver, silver paste, or any high electrical conducting material, including metal, alloys or superconducting metal, alloys or non-metal. In various implementations, the solid sheet of conductive metal 810 can may include metamaterials.

In various implementations, the solid sheet of conductive metal 810 may contain separate electrically non-conductive thermal control channels designed to maintain the temperature of the structure to a specified setting. In various implementations, the thermal control channels can be made from electrically conductive materials and integrated as to carry the electrical current.

Figure 9:
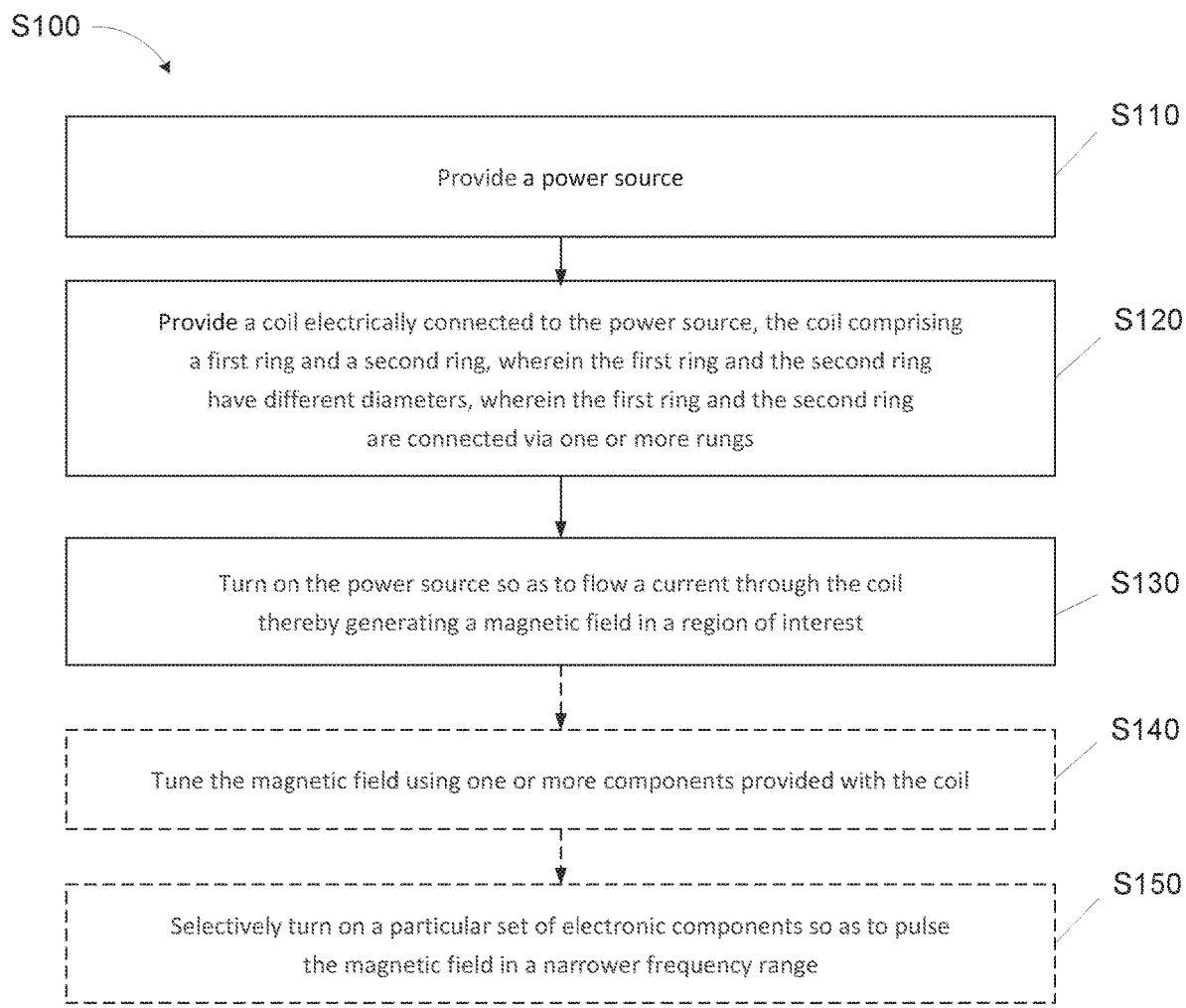
FIG. 9 is a flowchart for an example method of operating a magnetic imaging apparatus, in accordance with various embodiments.

FIG. 9 is a flowchart for an example method S100 of operating a magnetic imaging apparatus (e.g., apparatus 100, 500, or 600), in accordance with various embodiments. In accordance with various embodiments, the method S100 includes at step S110 providing a power source. As shown in FIG. 9, the method S100 includes at step S120 providing a coil electrically connected to the power source. In accordance with some embodiments, the coil includes a first ring and a second ring, wherein the first ring and the second ring have different diameters. In accordance with some embodiments, the first ring and the second ring are connected via one or more rungs, for example, of the apparatus 100, 500, or 600.

As shown in FIG. 9, the method S100 includes at step S130 turning on the power source so as to flow a current through the coil thereby generating a magnetic field in a region of interest. In accordance with various embodiments, the magnetic field is between about 1 µT and about 10 mT. In accordance with various embodiments, the magnetic field is pulsed at a radio frequency (RF) between about 1 kHz and about 2 GHz.

In accordance with various embodiments, the coil further includes one or more electronic components. As shown in FIG. 9, the method S100 optionally includes at step S140 tuning the magnetic field using one or more components provided with the coil. In accordance with various embodiments, tuning the magnetic field is performed via at least one of changing the current of the one or more electronic components or by changing physical locations of the one or more electronic components. In accordance with various embodiments, the one or more electronic components include at least one of a varactor, a PIN diode, a capacitor, an inductor, a MEMS switch, a solid state relay, or a mechanical relay. In accordance with various embodiments, at least one of the first ring, the second ring, and the one or more rungs are connected to a capacitor.

At step S150, the method S100 optionally includes selectively turning on a particular set of electronic components so as to pulse the magnetic field in a narrower frequency range, in accordance with various embodiments as disclosed herein.

Figure 10:
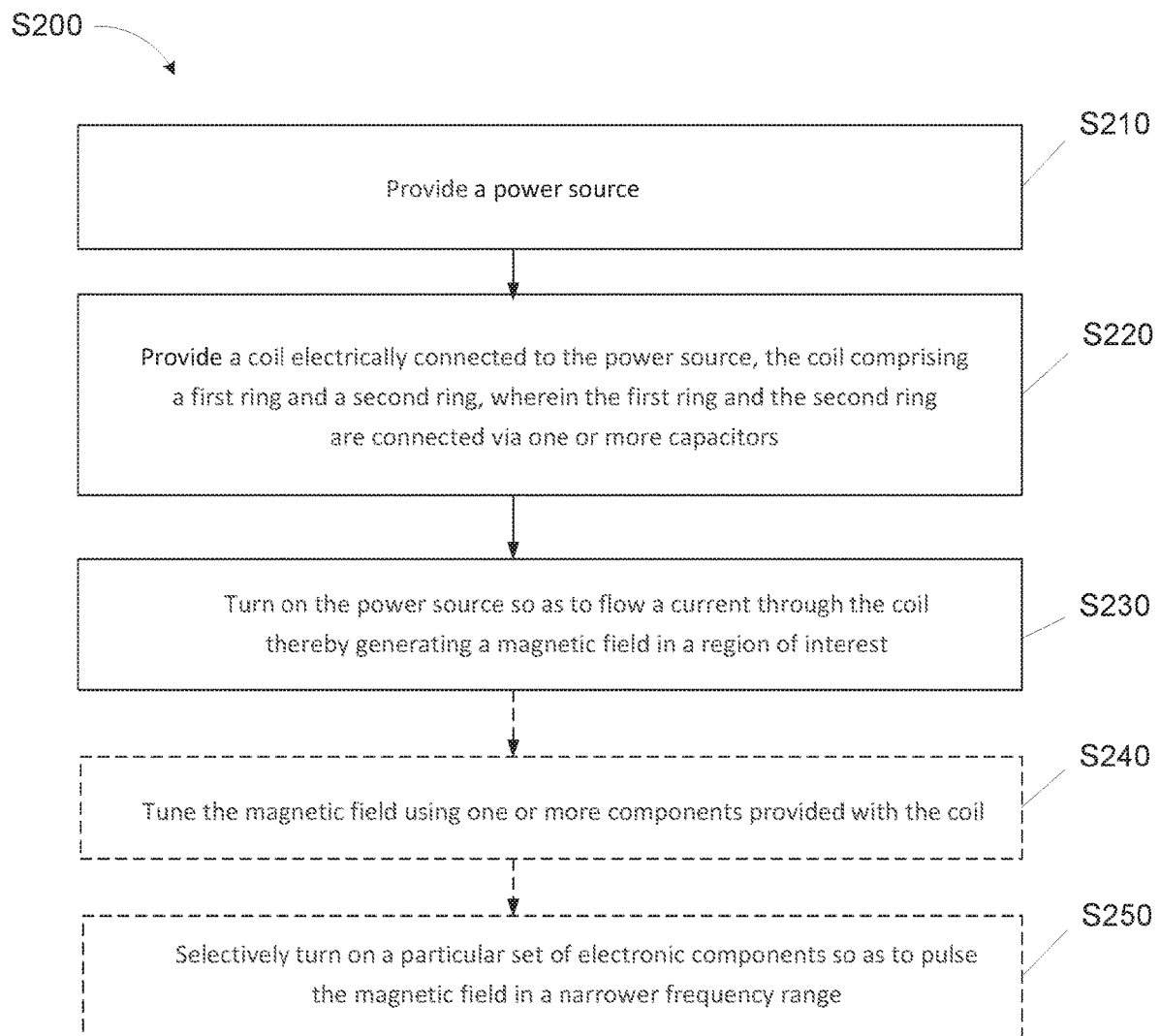
FIG. 10 is another flowchart for an example method of operating a magnetic imaging apparatus, in accordance with various embodiments.

FIG. 10 is another flowchart for an example method S200 of operating a magnetic imaging apparatus (e.g., apparatus 100, 500, or 600), in accordance with various embodiments. In accordance with various embodiments, the method S200 includes at step S210 providing a power source. As shown in FIG. 10, the method S200 includes at step S220 providing a coil electrically connected to the power source. In accordance with some embodiments, the coil includes a first ring and a second ring, wherein the first ring has a larger diameter than the second ring, for example, as shown and described with respect to the apparatus 100, 500, or 600.

At step S230, the method S200 includes turning on the power source so as to flow a current through the coil thereby generating a magnetic field in a region of interest. In accordance with various embodiments, the magnetic field is between about 1 µT and about 10 mT. In accordance with various embodiments, the magnetic field is pulsed at a radio frequency (RF) between about 1 kHz and about 2 GHz.

In accordance with various embodiments, the coil further includes one or more electronic components. As shown in FIG. 10, the method S200 optionally includes at step S240 tuning the magnetic field using one or more components provided with the coil. In accordance with various embodiments, tuning the magnetic field is performed via at least one of changing the current of the one or more electronic components or by changing physical locations of the one or more electronic components. In accordance with various embodiments, the one or more electronic components include at least one of a varactor, a PIN diode, a capacitor, an inductor, a MEMS switch, a solid state relay, or a mechanical relay. In accordance with various embodiments, at least one of the first ring, the second ring, and the one or more rungs are connected to a capacitor.

At step S250, the method S200 optionally includes selectively turning on a particular set of electronic components so as to pulse the magnetic field in a narrower frequency range, in accordance with various embodiments as disclosed herein.

Figure 11:
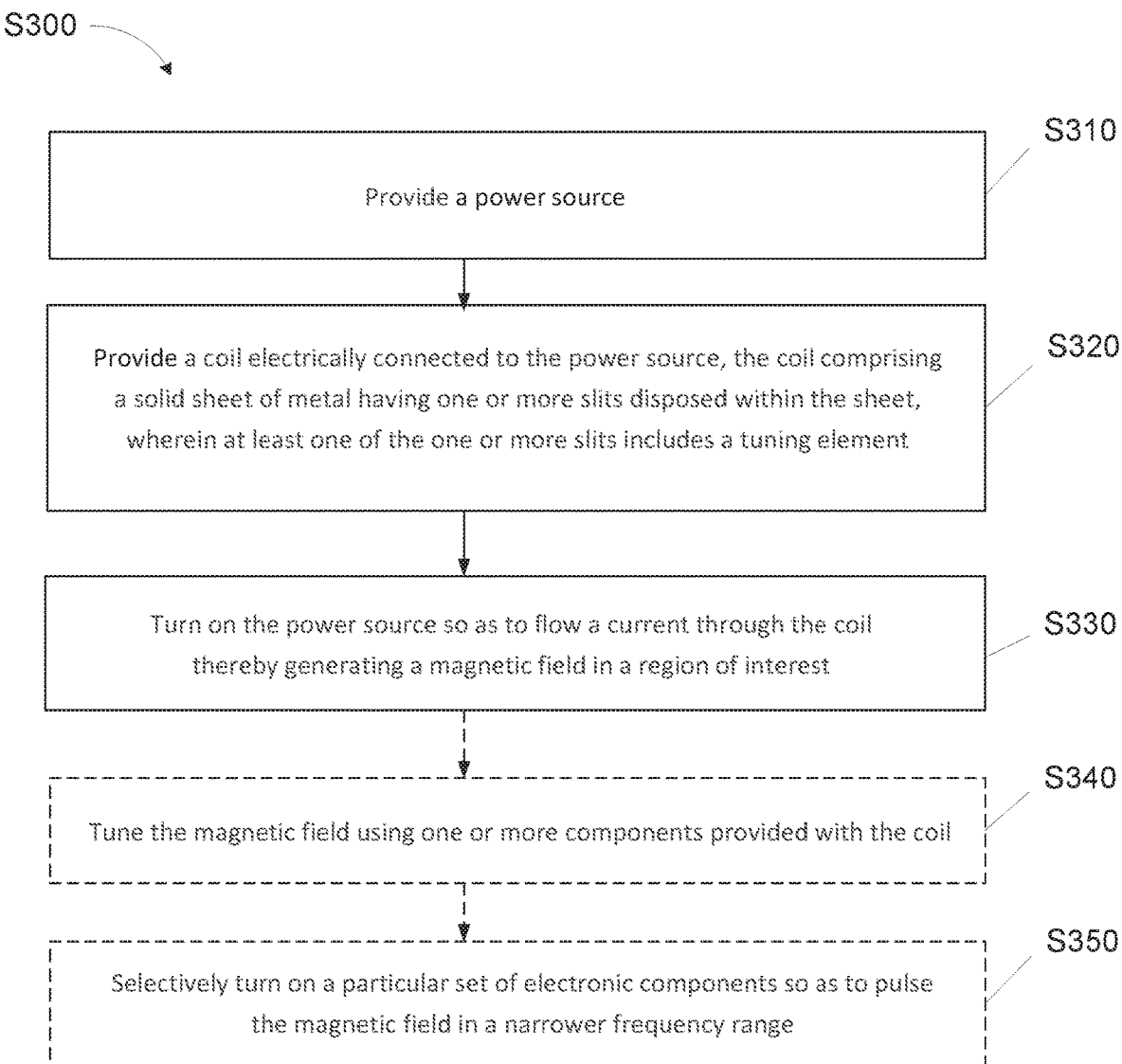
FIG. 11 is another flowchart for an example method of operating a magnetic imaging apparatus, in accordance with various embodiments.

FIG. 11 is another flowchart for an example method S300 of operating a magnetic imaging apparatus (e.g., apparatus 700a, 700b, 700c, or 800), in accordance with various embodiments. In accordance with various embodiments, the method S300 includes at step S310 providing a power source. As shown in FIG. 11, the method S300 includes at step S320 providing a coil electrically connected to the power source. In accordance with some embodiments, the coil includes a solid sheet of metal having one or more slits disposed within the sheet. In accordance with some embodiments, at least one of the one or more slits includes a tuning element, for example, of the apparatus 700a, 700b, 700c, or 800.

As shown in FIG. 11, the method S300 includes at step S330 turning on the power source so as to flow a current through the coil thereby generating a magnetic field in a region of interest. In accordance with various embodiments, the magnetic field is between about 1 µT and about 10 mT. In accordance with various embodiments, the magnetic field is pulsed at a radio frequency (RF) between about 1 kHz and about 2 GHz.

In accordance with various embodiments, the coil further includes one or more electronic components. As shown in FIG. 11, the method S300 optionally includes at step S340 tuning the magnetic field using one or more components provided with the coil. In accordance with various embodiments, tuning the magnetic field is performed via at least one of changing the current of the one or more electronic components or by changing physical locations of the one or more electronic components. In accordance with various embodiments, the one or more electronic components include at least one of a varactor, a PIN diode, a capacitor, an inductor, a MEMS switch, a solid state relay, or a mechanical relay. In accordance with various embodiments, at least one of the first ring, the second ring, and the one or more rungs are connected to a capacitor.

At step S350, the method S300 optionally includes selectively turning on a particular set of electronic components so as to pulse the magnetic field in a narrower frequency range, in accordance with various embodiments as disclosed herein.

RECITATION OF EMBODIMENTS

1. A magnetic imaging apparatus comprising: a power source for providing a current; and a coil electrically connected to the power source, the coil comprising a first ring and a second ring, wherein the first ring and the second ring have different diameters, wherein the first ring and the second ring are connected via one or more rungs, and wherein the power source is configured to flow current through the first ring, the second ring, and the one or more rungs to generate an electromagnetic field in a region of interest.

2. The apparatus of embodiment 1, wherein the electromagnetic field is between about 1 µT and about 10 mT.

3. The apparatus of anyone of embodiments 1-2, wherein the electromagnetic field is pulsed at a radio frequency between about 1 kHz and about 2 GHz.

4. The apparatus of anyone of embodiments 1-3, wherein the first ring, the second ring, and the one or more rungs are connected to form a single current loop.

5. The apparatus of anyone of embodiments 1-4, wherein the coil is non-planar and oriented to partially surround the region of interest.

6. The apparatus of anyone of embodiments 1-5, wherein the first ring, the second ring, and the one or more rungs are non-planar to each other.

7. The apparatus of anyone of embodiments 1-6, wherein one of the first and second ring is tilted with respect to the other ring.

8. The apparatus of anyone of embodiments 1-7, wherein one of the first or second ring is closer to the region of interest than the other ring.

9. The apparatus of anyone of embodiments 1-8, wherein the first ring and the second ring comprise different materials.

10. The apparatus of anyone of embodiments 1-9, wherein the first ring and the second ring have diameters between about 10 µm to about 10 m.

11. The apparatus of anyone of embodiments 1-10, wherein the first ring has a larger diameter than the second ring.

12. The apparatus of anyone of embodiments 1-11, wherein a diameter of the second ring is between a size of the region of interest and a diameter of the first ring.

13. The apparatus of anyone of embodiments 1-12, wherein the coil further comprises one or more electronic components for tuning the electromagnetic field.

14. The apparatus of embodiment 13, wherein the one or more electronic components include at least one of a varactor, a PIN diode, a capacitor, an inductor, a MEMS switch, a solid state relay, or a mechanical relay.

15. The apparatus of anyone of embodiments 13-14, wherein the one or more electronic components used for tuning includes at least one of dielectrics, capacitors, inductors, conductive metals, metamaterials, or magnetic metals.

16. The apparatus of anyone of embodiments 1-15, wherein the coil is cryogenically cooled.

17. The apparatus of anyone of embodiments 1-16, wherein at least one of the first ring, the second ring, and the one or more rungs comprise hollow tubes for fluid cooling.

18. The apparatus of anyone of embodiments 1-17, wherein at least one of the first ring and the second ring comprise a plurality of windings or litz wires.

19. The apparatus of anyone of embodiments 1-18, wherein at least one of the first ring, the second ring, and the one or more rungs are connected to a capacitor.

20. The apparatus of anyone of embodiments 1-19, wherein the first ring is attached to a first portion of the one or more rungs and the second ring is attached to a second portion of the one or more rungs, and wherein the first and second portion of the one or more rungs form an overlapping contact area.

21. The apparatus of embodiment 20, wherein the overlapping contact area is adjustable.

22. The apparatus of anyone of embodiments 20-21, wherein the first portion is a cylinder or a tube, and the second portion is a concentric tube, or vice versa, and wherein the first portion and the second portion are configured to slide past each other.

23. A method of operating a magnetic imaging apparatus comprising: providing a power source; providing a coil electrically connected to the power source, the coil comprising a first ring and a second ring, wherein the first ring and the second ring have different diameters, wherein the first ring and the second ring are connected via one or more rungs; and turning on the power source so as to flow a current through the coil thereby generating a magnetic field in a region of interest.

24. The method of embodiment 23, wherein the magnetic field is between about 1 µT and about 10 mT.

25. The method of anyone of embodiments 23-24, wherein the magnetic field is pulsed at a radio frequency (RF) between about 1 kHz and about 2 GHz.

26. The method of anyone of embodiments 23-25, wherein the coil further comprises one or more electronic components, the method further comprising: tuning the magnetic field using one or more components provided with the coil.

27. The method of embodiment 26, wherein tuning the magnetic field is performed via at least one of changing the current of the one or more electronic components or by changing physical locations of the one or more electronic components.

28. The method of embodiment 26, wherein the one or more electronic components include at least one of a varactor, a PIN diode, a capacitor, an inductor, a MEMS switch, a solid state relay, or a mechanical relay.

29. The method of anyone of embodiments 23-28, wherein at least one of the first ring, the second ring, and the one or more rungs are connected to a capacitor.

30. The method of anyone of embodiments 23-29, the method further comprises: selectively turning on a particular set of electronic components so as to pulse the magnetic field in a narrower frequency range.

31. A magnetic imaging apparatus comprising: a power source for providing a current; and a coil electrically connected to the power source, the coil comprising a first ring and a second ring, wherein the first ring and the second ring are connected via one or more capacitors, and wherein the power source is configured to flow current through the first ring, the second ring, and the one or more capacitors to generate an electromagnetic field in a region of interest.

32. The apparatus of embodiment 31, wherein the electromagnetic field is between about 1 µT and about 10 mT.

33. The apparatus of anyone of embodiments 31-32, wherein the electromagnetic field is pulsed at a radio frequency between about 1 kHz and about 2 GHz.

34. The apparatus of anyone of embodiments 31-33, wherein the first ring and the second ring are connected via one or more rungs.

35. The apparatus of anyone of embodiments 31-34, wherein the coil is non-planar and oriented to partially surround the region of interest.

36. The apparatus of anyone of embodiments 31-35, wherein the first ring, the second ring, and the one or more rungs are non-planar to each other.

37. The apparatus of anyone of embodiments 31-36, wherein one of the first and second ring is tilted with respect to the other ring.

38. The apparatus of anyone of embodiments 31-37, wherein one of the first or second ring is closer to the region of interest than the other ring.

39. The apparatus of anyone of embodiments 31-38, wherein the first ring and the second ring comprise different materials.

40. The apparatus of anyone of embodiments 31-39, wherein the first ring and the second ring have diameters between about 10 µm to about 10 m.

41. The apparatus of anyone of embodiments 31-40, wherein a diameter of the second ring is between a size of the region of interest and a diameter of the first ring.

42. The apparatus of anyone of embodiments 31-41, wherein the coil further comprises one or more electronic components for tuning the electromagnetic field.

43. The apparatus of embodiment 42, wherein the one or more electronic components include at least one of a varactor, a PIN diode, a capacitor, an inductor, a MEMS switch, a solid state relay, or a mechanical relay.

44. The apparatus of anyone of embodiments 42-43, wherein the one or more electronic components used for tuning includes at least one of dielectrics, capacitors, inductors, conductive metals, metamaterials, or magnetic metals.

45. The apparatus of anyone of embodiments 31-44, wherein the coil is cryogenically cooled.

46. The apparatus of anyone of embodiments 34-45, wherein at least one of the first ring, the second ring, and the one or more rungs comprise hollow tubes for fluid cooling.

47. The apparatus of anyone of embodiments 31-46, wherein at least one of the first ring and the second ring comprise a plurality of windings or litz wires.

48. The apparatus of anyone of embodiments 34-47, wherein at least one of the first ring, the second ring, and the one or more rungs are connected to a capacitor.

49. The apparatus of anyone of embodiments 34-48, wherein the first ring is attached to a first portion of the one or more rungs and the second ring is attached to a second portion of the one or more rungs, and wherein the first and second portion of the one or more rungs form an overlapping contact area.

50. The apparatus of embodiment 49, wherein the overlapping contact area is adjustable.

51. The apparatus of anyone of embodiments 49-50, wherein the first portion is a cylinder or a tube, and the second portion is a concentric tube, or vice versa, and wherein the first portion and the second portion are configured to slide past each other.

52. A method of operating a magnetic imaging apparatus comprising: providing a power source; providing a coil electrically connected to the power source, the coil comprising a first ring and a second ring, wherein the first ring and the second ring are connected via one or more capacitors; and turning on the power source so as to flow a current through the coil thereby generating a magnetic field in a region of interest.

53. The method of embodiment 52, wherein the magnetic field is between about 1 µT and about 10 mT.

54. The method of anyone of embodiments 52-53, wherein the magnetic field is pulsed at a radio frequency (RF) between about 1 kHz and about 2 GHz.

55. The method of anyone of embodiments 52-54, wherein the first ring and the second ring are connected via one or more rungs.

56. The method of anyone of embodiments 52-55, wherein the coil further comprises one or more electronic components, the method further comprising: tuning the magnetic field using one or more components provided with the coil.

57. The method of embodiment 56, wherein tuning the magnetic field is performed via at least one of changing the current of the one or more electronic components or by changing physical locations of the one or more electronic components.

58. The method of embodiment 56, wherein the one or more electronic components include at least one of a varactor, a PIN diode, a capacitor, an inductor, a MEMS switch, a solid state relay, or a mechanical relay.

59. The method of anyone of embodiments 55-58, wherein at least one of the first ring, the second ring, and the one or more rungs are connected to a capacitor.

60. The method of anyone of embodiments 52-59, the method further comprises: selectively turning on a particular set of electronic components so as to pulse the magnetic field in a narrower frequency range.

61. A magnetic imaging apparatus comprising: a power source for providing a current; and a coil electrically connected to the power source, the coil comprising a solid sheet of metal having one or more slits disposed within the sheet, wherein at least one of the one or more slits includes a tuning element, and wherein the power source is configured to flow current through the coil to generate an electromagnetic field in a region of interest.

62. The apparatus of embodiment 61, wherein the electromagnetic field is between about 1 µT and about 10 mT.

63. The apparatus of anyone of embodiments 61-62, wherein the electromagnetic field is pulsed at a radio frequency between about 1 kHz and about 2 GHz.

64. The apparatus of anyone of embodiments 61-63, wherein the coil is non-planar and oriented to partially surround the region of interest.

65. The apparatus of anyone of embodiments 61-64, wherein the coil has an outer edge with a diameter between about 10 µm to about 10 m.

66. The apparatus of anyone of embodiments 61-65, wherein the solid sheet of metal being a first sheet having a first slit with a first tuning element disposed therewithin, the coil further comprises: a second sheet of metal having a second slit having a second tuning element disposed therewithin, wherein the second sheet of metal is stacked on top of the first sheet such that the first slit and the second slit are offset rotationally.

67. The apparatus of anyone of embodiments 61-66, wherein the solid sheet of metal comprises at least two slits with each slit having a tuning element, wherein the at least two slits are positioned within the solid sheet of metal such that each of the tuning elements are positioned equally spaced from one another.

68. The apparatus of anyone of embodiments 61-67, further comprising: one or more electronic components for tuning the electromagnetic field, wherein the one or more electronic components include at least one of a varactor, a PIN diode, a capacitor, an inductor, a MEMS switch, a solid state relay, or a mechanical relay.

69. The apparatus of embodiment 68, wherein the one or more electronic components used for tuning includes at least one of dielectrics, capacitors, inductors, conductive metals, metamaterials, or magnetic metals.

70. The apparatus of anyone of embodiments 61-69, wherein the solid sheet of metal comprise hollow tubes for fluid cooling.

71. The apparatus of anyone of embodiments 61-70, wherein the coil is cryogenically cooled.

72. The apparatus of anyone of embodiments 61-71, wherein the tuning element comprises a capacitor.

73. A method of operating a magnetic imaging apparatus comprising: providing a power source; providing a coil electrically connected to the power source, the coil comprising a solid sheet of metal having one or more slits disposed within the sheet, wherein at least one of the one or more slits includes a tuning element; and turning on the power source so as to flow a current through the coil thereby generating a magnetic field in a region of interest.

74. The method of embodiment 73, wherein the magnetic field is between about 1 µT and about 10 mT.

75. The method of anyone of embodiments 73-74, wherein the magnetic field is pulsed at a radio frequency (RF) between about 1 kHz and about 2 GHz.

76. The method of anyone of embodiments 73-75, wherein the coil further comprises one or more electronic components, the method further comprising: tuning the magnetic field using one or more components provided with the coil.

77. The method of embodiment 76, wherein tuning the magnetic field is performed via at least one of changing the current of the one or more electronic components or by changing physical locations of the one or more electronic components.

78. The method of anyone of embodiments 76-77, wherein the one or more electronic components include at least one of a varactor, a PIN diode, a capacitor, an inductor, a MEMS switch, a solid state relay, or a mechanical relay.

79. The method of anyone of embodiments 73-78, wherein the tuning element comprises a capacitor.

80. The method of anyone of embodiments 73-79, the method further comprises: selectively turning on a particular set of electronic components so as to pulse the magnetic field in a narrower frequency range.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A magnetic imaging apparatus comprising:
a power source for providing a current; and
a coil electrically connected to the power source, the coil comprising:
a first ring; and
a second ring, wherein the first ring and the second ring have different diameters, wherein the first ring and the second ring are connected via one or more rungs, and wherein the first ring, the second ring, and the one or more rungs are non-planar to each other;
wherein the power source is configured to flow current through the first ring, the second ring, and the one or more rungs to generate an electromagnetic field outwards from the coil in a region of interest such that at least a portion of the region of interest is outside of the coil.

2. The apparatus of claim 1, wherein the electromagnetic field is between about 1 μT and about 10 mT.

3. The apparatus of claim 1, wherein the electromagnetic field is pulsed at a radio frequency between about 1 kHz and about 2 GHz.

4. The apparatus of claim 1, wherein the first ring, the second ring, and the one or more rungs are connected to form a single current loop.

5. The apparatus of claim 1, wherein the coil is non-planar and oriented to partially surround the region of interest.

6. The apparatus of claim 1, wherein one of the first and second ring is tilted with respect to the other ring.

7. The apparatus of claim 1, wherein one of the first or second ring is closer to the region of interest than the other ring.

8. The apparatus of claim 1, wherein the first ring and the second ring comprise different materials.

9. The apparatus of claim 1, wherein the first ring and the second ring have diameters between about 10 μm to about 10 m.

10. The apparatus of claim 1, wherein the first ring has a larger diameter than the second ring.

11. The apparatus of claim 1, wherein a diameter of the second ring is between a size of the region of interest and a diameter of the first ring.

12. The apparatus of claim 1, wherein the coil further comprises one or more electronic components for tuning the electromagnetic field.

13. The apparatus of claim 12, wherein the one or more electronic components include at least one of a varactor, a PIN diode, a capacitor, an inductor, a MEMS switch, a solid state relay, or a mechanical relay.

14. The apparatus of claim 12, wherein the one or more electronic components used for tuning includes at least one of dielectrics, capacitors, inductors, conductive metals, metamaterials, or magnetic metals.

15. The apparatus of claim 1, wherein the coil is cryogenically cooled.

16. The apparatus of claim 1, wherein at least one of the first ring, the second ring, and the one or more rungs comprise hollow tubes for fluid cooling.

17. The apparatus of claim 1, wherein at least one of the first ring and the second ring comprise a plurality of windings or litz wires.

18. The apparatus of claim 1, wherein at least one of the first ring, the second ring, and the one or more rungs are connected to a capacitor.

19. The apparatus of claim 1, wherein the one or more rungs comprise a rung, wherein the first ring is attached to a first portion of the rung and the second ring is attached to a second portion of the rung, and wherein the first and second portion of the rung form an overlapping contact area.

20. The apparatus of claim 19, wherein the overlapping contact area is adjustable.

21. A magnetic imaging apparatus, comprising:
a power source for providing a current; and
a coil electrically connected to the power source, the coil comprising:
a first ring; and
a second ring, wherein the first ring and the second ring have different diameters, wherein the first ring and the second ring are connected via one or more rungs, and wherein the first ring, the second ring, and the one or more rungs are non-planar to each other;
wherein the power source is configured to flow current through the first ring, the second ring, and the one or more rungs to generate an electromagnetic field outwards from the coil in a region of interest;
wherein the one or more rungs comprise a rung, wherein the first ring is attached to a first portion of the rung and the second ring is attached to a second portion of the rung, and wherein the first and second portion of the rung form an overlapping contact area; and
wherein the first portion is a cylinder or a tube, and the second portion is a concentric tube, or vice versa, and wherein the first portion and the second portion are configured to slide past each other.

22. A method of operating a magnetic imaging apparatus comprising:
providing a power source;
providing a coil electrically connected to the power source, the coil comprising a first ring and a second ring, wherein the first ring and the second ring have different diameters, and wherein the first ring and the second ring are connected via one or more rungs;
turning on the power source so as to flow a current through the coil thereby projecting a magnetic field outwards and away from the coil to a region of interest such that at least a portion of the region of interest is outside of the coil; and obtaining imaging data.

23. The method of claim 22, wherein the magnetic field is between about 1 μT and about 10 mT.

24. The method of claim 22, wherein the magnetic field is pulsed at a radio frequency (RF) between about 1 kHz and about 2 GHz.

25. The method of claim 22, wherein the coil further comprises one or more electronic components, the method further comprising:
tuning the magnetic field using one or more components provided with the coil.

26. The method of claim 25, wherein tuning the magnetic field is performed via at least one of changing the current of the one or more electronic components or by changing physical locations of the one or more electronic components.

27. The method of claim 25, wherein the one or more electronic components include at least one of a varactor, a PIN diode, a capacitor, an inductor, a MEMS switch, a solid state relay, or a mechanical relay.

28. The method of claim 22, wherein at least one of the first ring, the second ring, and the one or more rungs are connected to a capacitor.

29. A method of operating a magnetic imaging apparatus, the method comprising:
- providing a power source;
- providing a coil electrically connected to the power source, the coil comprising a first ring and a second ring, wherein the first ring and the second ring have different diameters, and wherein the first ring and the second ring are connected via one or more rungs, wherein the coil further comprises one or more electronic components, wherein the one or more electronic components include at least one of a varactor, a PIN diode, a capacitor, an inductor, a MEMS switch, a solid state relay, or a mechanical relay;
- turning on the power source so as to flow a current through the coil thereby projecting a magnetic field outwards and away from the coil to a region of interest; wherein the electromagnetic field is pulsed at a radio frequency of a first range
- tuning the magnetic field using one or more components provided with the coil, wherein the method further comprises:
- selectively turning on a particular set of electronic components so as to pulse the magnetic field in a second frequency range wherein the second frequency range is narrower than the first frequency range; and obtaining imaging data.

* * * * *